(12) United States Patent
Kiyotomi

(10) Patent No.: US 9,308,542 B2
(45) Date of Patent: Apr. 12, 2016

(54) TREATMENT SOLUTION SUPPLY APPARATUS, TREATMENT SOLUTION SUPPLY METHOD, AND COMPUTER STORAGE MEDIUM

(75) Inventor: Akiko Kiyotomi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 37 days.

(21) Appl. No.: 14/233,007

(22) PCT Filed: May 15, 2012

(86) PCT No.: PCT/JP2012/062394
§ 371 (c)(1),
(2), (4) Date: Jan. 15, 2014

(87) PCT Pub. No.: WO2013/018414
PCT Pub. Date: Feb. 7, 2013

(65) Prior Publication Data
US 2014/0158791 A1 Jun. 12, 2014

(30) Foreign Application Priority Data

Jul. 29, 2011 (JP) ................................. 2011-167607
Jul. 29, 2011 (JP) ................................. 2011-167612

(51) Int. Cl.
*B05B 15/02* (2006.01)
*F23D 11/34* (2006.01)
(Continued)

(52) U.S. Cl.
CPC ................ *B05B 15/025* (2013.01); *G03F 1/82* (2013.01); *G03F 7/3021* (2013.01); *H01L 21/6715* (2013.01); *H01L 21/67057* (2013.01); *H01L 21/67178* (2013.01); *G03F 7/3057* (2013.01)

(58) Field of Classification Search
CPC ........ B05B 5/043; B03C 3/16; B01D 49/003; A61C 9/14; A61C 2202/25
USPC .................... 239/690, 690.1, 704, 706, 707, 3
See application file for complete search history.

(56) References Cited

U.S. PATENT DOCUMENTS 3,384,446 A * 5/1968 Ziems et al. .................. 422/121
5,682,591 A * 10/1997 Inculet et al. .................... 419/38
(Continued)

FOREIGN PATENT DOCUMENTS

| JP | 07-094459 A | 4/1995 |
| JP | 09-289156 A | 11/1997 |

(Continued)

OTHER PUBLICATIONS

International Search Report mailed Jun. 19, 2012 for the corresponding international application No. PCT/JP2012/062394 (with English translation).

*Primary Examiner* — Davis Hwu
(74) *Attorney, Agent, or Firm* — Posz Law Group, PLC

(57) ABSTRACT

A treatment solution supply apparatus that supplies a treatment solution from a treatment solution supply source via a treatment solution supply pipe to a supply nozzle, includes: electrodes that are provided at the treatment solution supply pipe and apply a DC voltage to the treatment solution in the treatment solution supply pipe; a power unit that applies the DC voltage to the electrodes while freely reversing a polarity of the DC voltage; a cleaning solution supply pipe connected to the treatment solution supply pipe and configured to supply a cleaning solution from a cleaning solution supply source to the treatment solution supply pipe; and a waste solution pipe that drains the cleaning solution passed through a position of the treatment solution supply pipe where the electrodes are provided.

17 Claims, 17 Drawing Sheets

(51) Int. Cl.
*G03F 1/82* (2012.01)
*H01L 21/67* (2006.01)
*G03F 7/30* (2006.01)

(56) References Cited

U.S. PATENT DOCUMENTS

| | | |
|---|---|---|
| 8,053,180 B2 | 11/2011 | Ono et al. |
| 2003/0038032 A1* | 2/2003 | Reel et al. .................... 204/643 |
| 2003/0165756 A1 | 9/2003 | Ono et al. |
| 2005/0266359 A1 | 12/2005 | Ono et al. |
| 2008/0013946 A1 | 1/2008 | Ono et al. |
| 2008/0079917 A1 | 4/2008 | Ono et al. |
| 2008/0284989 A1 | 11/2008 | Ono et al. |
| 2009/0032401 A1* | 2/2009 | Ronaghi et al. ............... 204/549 |

FOREIGN PATENT DOCUMENTS

| | | |
|---|---|---|
| JP | 10-305256 A | 11/1998 |
| JP | 2003-324064 A | 11/2003 |
| JP | 2005-334775 A | 12/2005 |
| JP | 2006-066799 A | 3/2006 |
| JP | 2007-035776 A | 2/2007 |
| JP | 2007-258367 A | 10/2007 |
| JP | 2010-103366 A | 5/2010 |
| JP | 2010-192549 A | 9/2010 |
| JP | 2011-100863 A | 5/2011 |

* cited by examiner

A

TREATMENT SOLUTION SUPPLY APPARATUS, TREATMENT SOLUTION SUPPLY METHOD, AND COMPUTER STORAGE MEDIUM

CROSS REFERENCE TO RELATED APPLICATION

The present application is a U.S. national stage of PCT/JP2012/062394 filed on May 15, 2012, and is based on Japanese Patent Application No. 2011-167607 filed on Jul. 29, 2011 and No. 2011-167612 filed on Jul. 29, 2011, the disclosures of which are incorporated herein by reference.

TECHNICAL FIELD

The present invention relates to a treatment solution supply apparatus that supplies a treatment solution such as a developing solution or pure water to a substrate, a treatment solution supply method and a computer storage medium.

BACKGROUND ART

In a photolithography process in a manufacturing process of a semiconductor device, for example, a series of treatments such as a resist coating treatment of applying a resist solution onto a wafer to form a resist film, exposure processing of exposing the resist film to a predetermined pattern, a developing treatment of developing the exposed resist film and so on are performed in sequence to form a predetermined resist pattern on the wafer. The series of treatments are performed in a coating and developing treatment system being a substrate treatment system including various treatment units that treat the wafer, transfer mechanisms that transfer the wafer and so on.

A coating treatment apparatus that supplies a treatment solution such as a developing solution, pure water, or thinner used for the above-described photolithography process to perform a coating treatment includes, for example, a treatment solution supply apparatus 400 as illustrated in FIG. 24. The treatment solution supply apparatus 400 includes, for example, a supply pump 404 that supplies the treatment solution stored in a treatment solution storage tank 401 to a coating nozzle 403 of the coating treatment apparatus via a treatment solution supply pipe 402, and a valve 405 that controls supply and stop of the treatment solution. A filter 406 that filtrates the treatment solution is provided in the treatment solution supply pipe 402 to remove fine foreign substances (particles) floating in the treatment solution (Patent Document 1).

[Patent Document 1] Japanese Laid-open Patent Publication No. H10-305256

DISCLOSURE OF THE INVENTION

Problems to be Solved by the Invention

Incidentally, with miniaturization of semiconductor devices in recent years, control of fine defects of nanometer order becomes necessary. Therefore, it is demanded to remove, from the treatment solution, fine particles of about several tens of nanometers that have not brought about a big problem before. This is because, if the treatment solution is supplied onto the wafer without removing the fine particles, the fine particles remain on the wafer to cause defects of the wafer.

However, it is difficult to completely remove the fine particles of about several tens of nanometers by the conventional filter. In this case, it is conceivable that the number of meshes of the filter is decreased to cope with the removal, but manufacture of the filter of a small number of meshes requires advanced processing technique, resulting in increased cost.

Further, when the number of meshes of the filter is decreased, the filter increases in differential pressure and become more likely to clog, thus bringing about a problem of necessity of frequent maintenance of the filter.

The present invention has been made in consideration of the above points, and its object is to efficiently remove fine particles of nanometer order contained in a treatment solution.

Means for Solving the Problems

To achieve the above object, the present invention is a treatment solution supply apparatus that supplies a treatment solution from a treatment solution supply source via a treatment solution supply pipe to a supply nozzle that supplies the treatment solution to a substrate, the treatment solution supply apparatus including: electrodes that are provided at the treatment solution supply pipe and apply a DC voltage to the treatment solution in the treatment solution supply pipe; a power supply unit that applies the DC voltage to the electrodes while freely reversing a polarity of the DC voltage; a cleaning solution supply pipe that is connected to the treatment solution supply pipe and configured to supply a cleaning solution from a cleaning solution supply source to the treatment solution supply pipe; and a waste solution pipe that drains the cleaning solution passed through a position of the treatment solution supply pipe where the electrodes are provided, from the treatment solution supply pipe.

Generally, a particle in the treatment solution has either positive or negative charge and is thus charged. According to the present invention, electrodes that apply a DC voltage to the treatments solution in a treatment solution supply pipe are provided, so that the fine particles in the treatment solution which have been difficult to remove by the conventional filter can be collected by the electrodes. Further, a cleaning solution supply pipe configured to supply a cleaning solution from a cleaning solution supply source to the treatment solution supply pipe and a waste solution pipe that drains the cleaning solution passed through a position of the treatment solution supply pipe where the electrodes are provided, from the treatment solution supply pipe are provided, and a power supply unit that applies the DC voltage to the electrodes can freely reverse a polarity of the DC voltage, so that the polarity of the voltage applied to the electrodes is reversed when supplying the cleaning solution to the treatment solution supply pipe to release the particles collected by the electrodes and then the cleaning solution is drained from the waste solution pipe, thereby making it possible to quickly drain the particles collected by the electrodes to the outside of the system of the treatment solution supply pipe. Thus, the inside of the treatment solution supply pipe can be kept clean. Consequently, according to the present invention, the fine particles in the treatment solution which have been difficult to remove by the conventional filter are removed, and a replacement work due to clogging never occurs, unlike the conventional filter, thereby facilitating maintenance. This enables efficient removal of the particles.

The present invention according to another aspect is a treatment solution supply method of supplying a treatment solution from a treatment solution supply source via a treatment solution supply pipe to a supply nozzle that supplies the treatment solution to a substrate, the treatment solution supply method including: supplying the treatment solution to the substrate while collecting foreign substances in the treatment solution by electrodes that are provided at the treatment solution supply pipe by applying a DC voltage to the treatment solution in the treatment solution supply pipe via the electrodes; then, stopping the supplying the treatment solution; then, supplying a cleaning solution to the treatment solution supply pipe with a polarity of the DC voltage applied to the electrodes reversed or the applying the voltage to the electrodes stopped; and then, draining the cleaning solution passed through a position of the treatment solution supply pipe where the electrodes are provided, from the treatment solution supply pipe.

The present invention according to another aspect is a computer-readable storage medium storing a program running on a computer of a control unit that controls a treatment solution supply apparatus to cause the treatment solution supply apparatus to execute a treatment solution supply method of supplying a treatment solution from a treatment solution supply source via a treatment solution supply pipe to a supply nozzle that supplies the treatment solution to a substrate, the treatment solution supply method including: supplying the treatment solution to the substrate while collecting foreign substances in the treatment solution by electrodes that are provided at the treatment solution supply pipe by applying a DC voltage to the treatment solution in the treatment solution supply pipe via the electrodes; then, stopping the supplying the treatment solution; then, supplying a cleaning solution to the treatment solution supply pipe with a polarity of the DC voltage applied to the electrodes reversed or the applying the voltage to the electrodes stopped; and then, draining the cleaning solution passed through a position of the treatment solution supply pipe where the electrodes are provided, from the treatment solution supply pipe.

The present invention according to another aspect is a treatment solution supply apparatus that supplies a treatment solution from a treatment solution supply source via a treatment solution supply pipe to a supply nozzle that supplies the treatment solution to a substrate, the treatment solution supply apparatus including: an intermediate storage tank that is provided between the treatment solution supply source and the supply nozzle along the treatment solution supply pipe and temporarily stores the treatment solution supplied from the treatment solution supply source, wherein the intermediate storage tank includes: electrodes that apply a DC voltage to the treatment solution stored inside the intermediate storage tank; a power supply unit that applies the DC voltage to the electrodes while freely reversing a polarity of the DC voltage; a cleaning solution supply pipe that supplies a cleaning solution to the intermediate storage tank; and a waste solution pipe that drains the cleaning solution from the intermediate storage tank.

Generally, a particle in the treatment solution has either positive or negative charge and is thus charged. According to the present invention, electrodes are provided in an intermediate storage tank, so that the fine particles in the treatment solution which have been difficult to remove by the conventional filter can be collected by the electrodes by applying a DC voltage to the electrodes. Further, a cleaning solution supply pipe configured to supply a cleaning solution from a cleaning solution supply source to the intermediate storage tank and a waste solution pipe that drains the cleaning solution from the intermediate storage tank are provided, and a power supply unit that applies the voltage to the electrodes can freely reverse a polarity of the voltage, so that the polarity of the DC voltage applied to the electrodes is reversed when supplying the cleaning solution to the intermediate storage tank to release the particles collected by the electrodes and then the cleaning solution is drained from the waste solution pipe, thereby making it possible to quickly drain the particles collected by the electrodes to the outside of the system of the intermediate storage tank. Thus, the inside of the intermediate storage tank can be kept clean. Consequently, according to the present invention, the fine particles in the treatment solution which have been difficult to remove by the conventional filter are removed, and a replacement work due to clogging never occurs, unlike the conventional filter, thereby facilitating maintenance. This enables efficient removal of the particles.

The present invention according to another aspect is a treatment solution supply method of supplying a treatment solution from a treatment solution supply source via a treatment solution supply pipe to a supply nozzle that supplies the treatment solution to a substrate, the treatment solution supply method including: temporarily storing the treatment solution supplied from the treatment solution supply source in an intermediate storage tank that is provided between the treatment solution supply source and the supply nozzle along the treatment solution supply pipe; then, collecting foreign substances in the treatment solution by electrodes that are provided at the intermediate storage tank by applying a DC voltage to the treatment solution in the intermediate storage tank via the electrodes; then, supplying the treatment solution from which the foreign substances have been removed in the intermediate storage tank, to the supply nozzle; stopping the supplying the treatment solution to the supply nozzle, and then reversing a polarity of the DC voltage applied to the electrodes or stopping the applying the voltage to the electrodes; then, supplying a cleaning solution to the intermediate storage tank to clean an inside of the intermediate storage tank; and then, draining the cleaning solution in the intermediate storage tank to an outside of the intermediate storage tank.

The present invention according to another aspect is a computer-readable storage medium storing a program running on a computer of a control unit that controls a treatment solution supply apparatus to cause the treatment solution supply apparatus to execute a treatment solution supply method of supplying a treatment solution from a treatment solution supply source via a treatment solution supply pipe to a supply nozzle that supplies the treatment solution to a substrate, the treatment solution supply method including: temporarily storing the treatment solution supplied from the treatment solution supply source in an intermediate storage tank that is provided between the treatment solution supply source and the supply nozzle along the treatment solution supply pipe; then, collecting foreign substances in the treatment solution by electrodes that are provided at the intermediate storage tank by applying a DC voltage to the treatment solution in the intermediate storage tank via the electrodes; then, supplying the treatment solution from which the foreign substances have been removed in the intermediate storage tank, to the supply nozzle; stopping the supplying the treatment solution to the supply nozzle, and then reversing a polarity of the DC voltage applied to the electrodes or stopping the applying the voltage to the electrodes; then, supplying a cleaning solution to the intermediate storage tank to clean an inside of the intermediate storage tank; and then, draining the cleaning solution in the intermediate storage tank to an outside of the intermediate storage tank.

Effect of the Invention

According to the present invention, fine particles of nanometer order contained in a treatment solution can be efficiently removed.

EMBODIMENT FOR CARRYING OUT THE INVENTION

Figure 1:
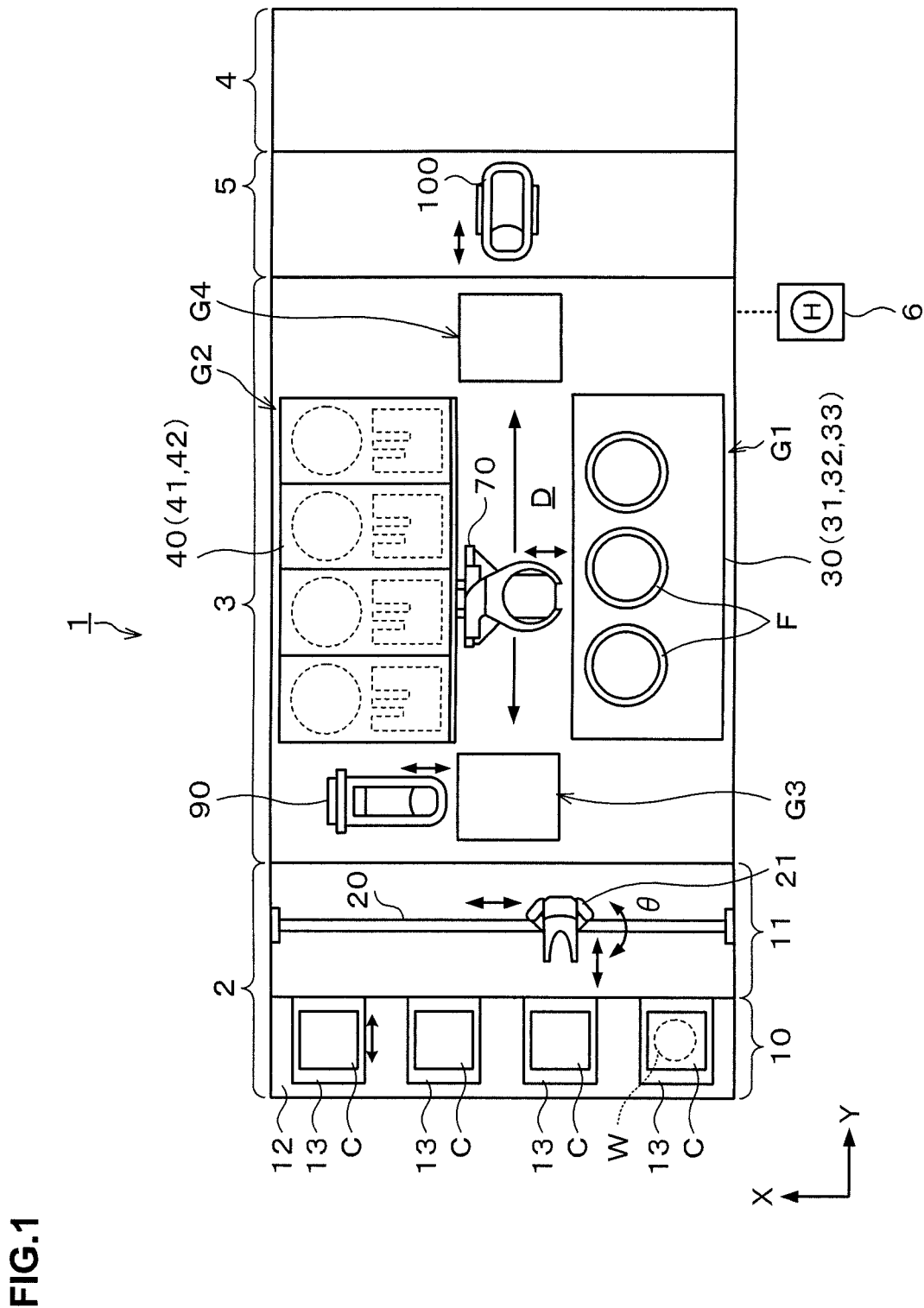
FIG. 1 A plan view illustrating the outline of an internal configuration of a substrate treatment system according to this embodiment.
Figure 2:
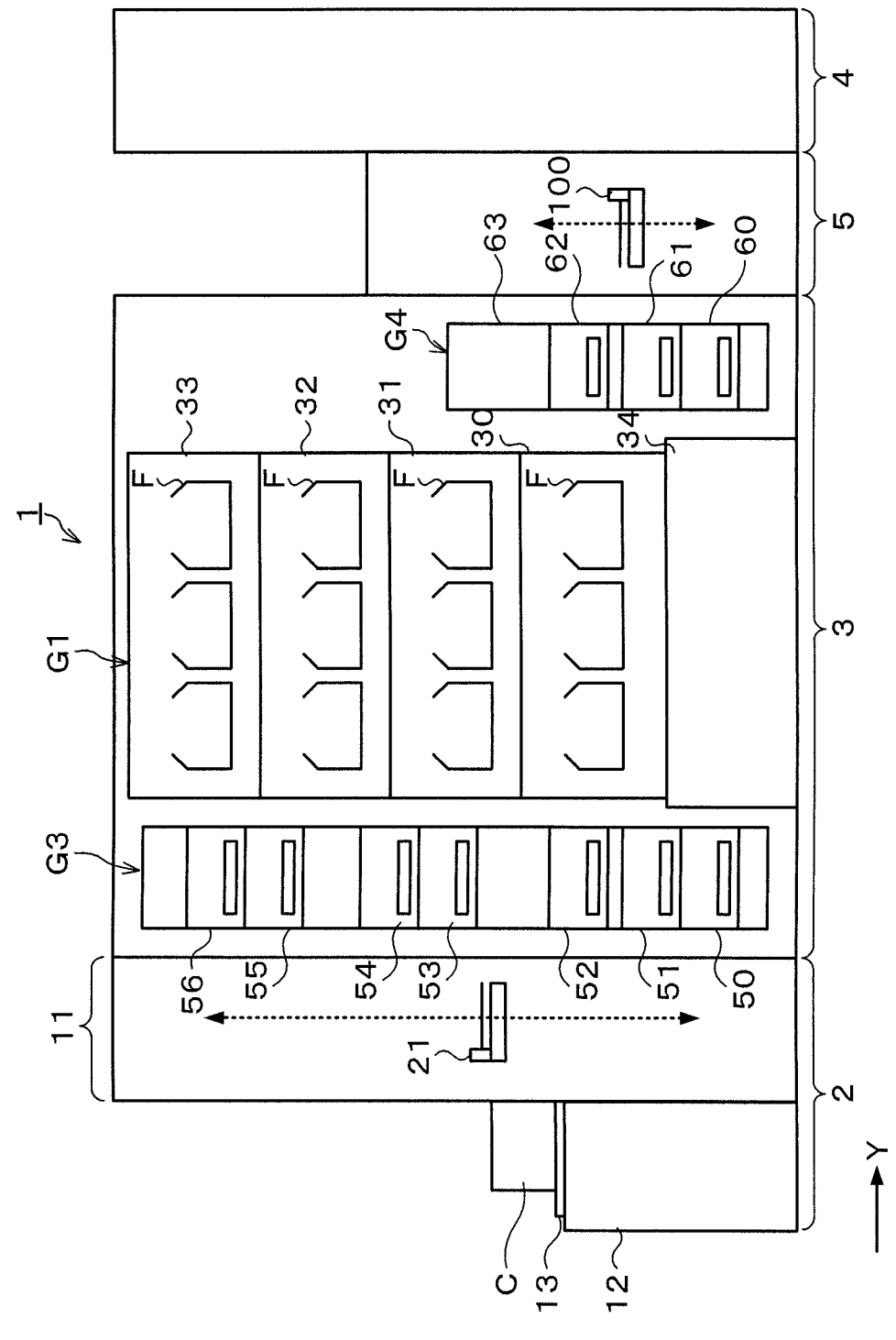
FIG. 2 A side view illustrating the outline of the internal configuration of the substrate treatment system according to this embodiment.
Figure 3:
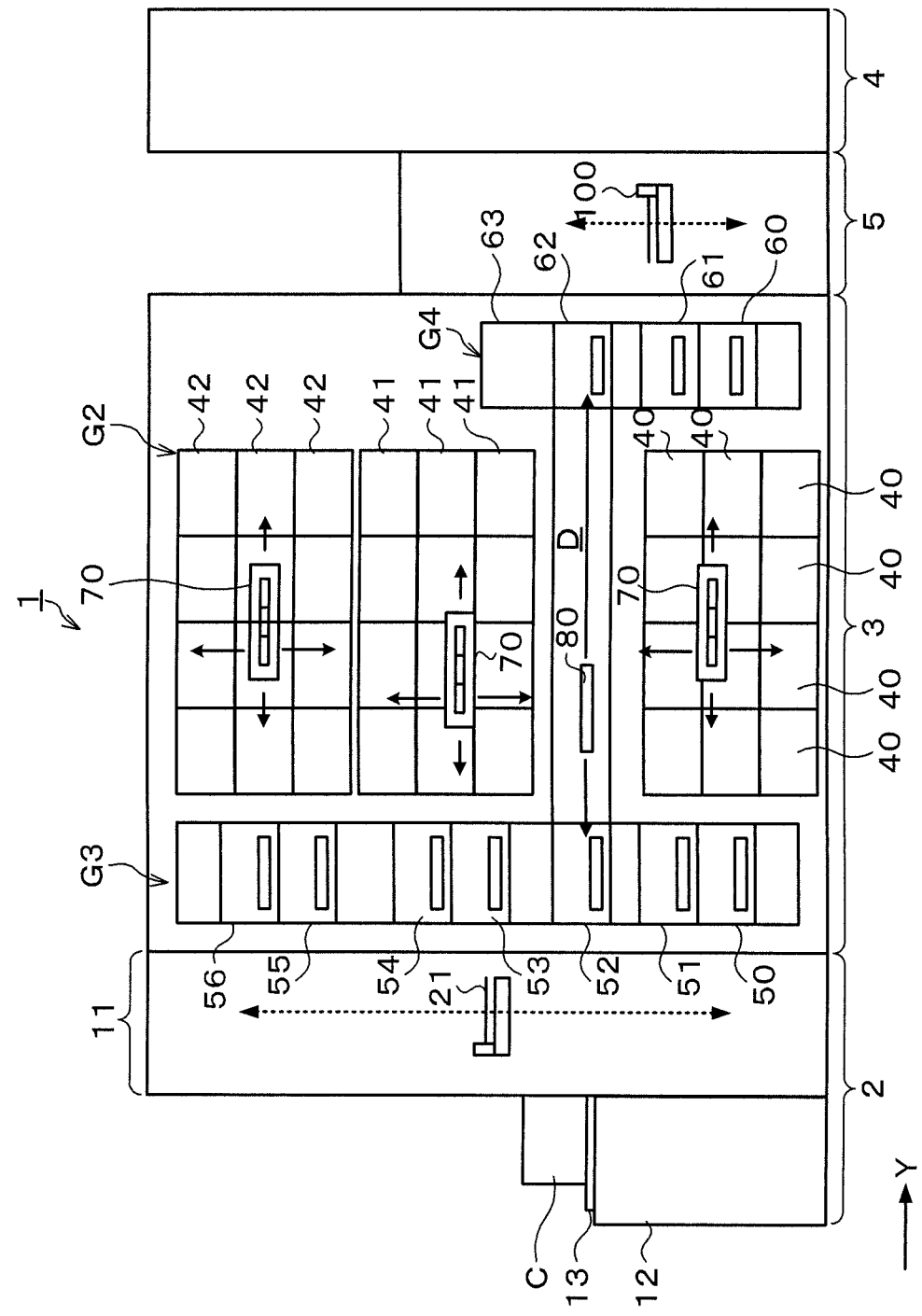
FIG. 3 A side view illustrating the outline of the internal configuration of the substrate treatment system according to this embodiment.

Hereinafter, an embodiment of the present invention will be described. FIG. 1 is an explanatory view illustrating the outline of an internal configuration of a substrate treatment system 1 including a treatment solution supply apparatus according to this embodiment. FIG. 2 and FIG. 3 are side views illustrating the outline of the internal configuration of the substrate treatment system 1. Note that a case that the substrate treatment system 1 is a coating and developing treatment system that performs, for example, photolithography processing on the substrate and a treatment solution is, for example, a developing solution or pure water used for a coating and developing treatment will be described as an example in this embodiment.

The substrate treatment system 1 has, as illustrated in FIG. 1, a configuration in which, for example, a cassette station 2 as a transfer-in/out section to/from which a cassette C is transferred in/out from/to, for example, the outside, a treatment station 3 as a treatment section including a plurality of various kinds of treatment units that perform predetermined treatments in a manner of single wafer treatment in the photolithography processing, and an interface station 5 as a transfer section that delivers the wafer W to/from an exposure apparatus 4 adjacent to the treatment station 3, are integrally connected. Further, the substrate treatment system 1 has a control unit 6 that performs control of the substrate treatment system 1.

The cassette station 2 is divided into a cassette transfer-in/out section 10 and a wafer transfer section 11. The cassette transfer-in/out section 10 is provided at the end on a Y-direction negative direction (a left direction in FIG. 1) side in the substrate treatment system 1. In the cassette transfer-in/out section 10, a cassette mounting table 12 is provided. On the cassette mounting table 12, a plurality of, for example, four mounting plates 13 are provided. The mounting plates 13 are arranged side by side in a line in an X-direction (a top and bottom direction in FIG. 1) being the horizontal direction. On the mounting plates 13, cassettes C can be mounted when the cassettes C are transferred in/out from/to the outside of the substrate treatment system 1.

In the wafer transfer section 11, a wafer transfer apparatus 21 is provided which is movable on a transfer path 20 extending in the X-direction as illustrated in FIG. 1. The wafer transfer apparatus 21 is movable also in the vertical direction and around a vertical axis (in a θ-direction), and can transfer the wafer W between the cassette C on each of the cassette mounting plates 13 and a later-described delivery apparatus in a third block G3 in the treatment station 3.

In the treatment station 3, a plurality of, for example, four blocks G1, G2, G3, G4 are provided each including various units. For example, the first block G1 is provided on the front side (an X-direction negative direction side in FIG. 1) in the treatment station 3, and the second block G2 is provided on the rear side (an X-direction positive direction side in FIG. 1) in the treatment station 3. Further, the third block G3 is provided on the cassette station 2 side (a Y-direction negative direction side in FIG. 1) in the treatment station 3, and the fourth block G4 is provided on the interface station 5 side (a Y-direction positive direction side in FIG. 1) in the treatment station 3.

For example, in the first block G1, as illustrated in FIG. 2, a plurality of solution treatment units such as a developing treatment unit 30 that performs developing treatment on the wafer W, a lower anti-reflection film forming unit 31 that forms an anti-reflection film under a resist film of the wafer W (hereinafter, referred to as a "lower anti-reflection film"), a resist coating unit 32 that applies a resist solution to the wafer W to form a resist film, and an upper anti-reflection film forming unit 33 that forms an anti-reflection film over the resist film of the wafer W (hereinafter, referred to as an "upper anti-reflection film"), are four-tiered in order from the bottom. Further, a chemical box 34 for supplying various solutions to the solution treatment units in the block G1 is provided on the lowermost tier of the first block G1.

Each of the units 30 to 33 in the first block G1 has a plurality of cups F capable of housing wafers W therein during treatment and thus can treat a plurality of wafers W in parallel.

For example, in the second block G2, as illustrated in FIG. 3, thermal treatment units 40 each of which performs thermal treatment on the wafer W, adhesion units 41 each of which performs hydrophobic treatment on the wafer W, and edge exposure unit 42 each of which exposes the outer peripheral portion of the wafer W are arranged one on top of the other in the vertical direction and side by side in the horizontal direction. The thermal treatment unit 40 has a thermal plate that mounts and heats the wafer W thereon and a cooling plate that mounts and cools the wafer W thereon, and thereby can perform both of heat treatment and cooling treatment. Note that the numbers and the arrangement of the thermal treatment units 40, adhesion units 41, and edge exposure units 42 can be arbitrarily selected.

For example, in the third block G3, a plurality of delivery units 50, 51, 52, 53, 54, 55, 56 are provided in order from the bottom. Further, in the fourth block G4, a plurality of delivery units 60, 61, 62, and a defect inspection unit 63 are provided in order from the bottom.

A wafer transfer region D is formed in a region surrounded by the first block G1 to the fourth block G4 as illustrated in FIG. 1. In the wafer transfer region D, for example, a wafer transfer apparatus 70 is arranged.

The wafer transfer apparatus 70 has a transfer arm that is movable, for example, in the Y-direction, the forward and backward direction, the θ-direction, and the vertical direction. The wafer transfer apparatus 70 can move in the wafer transfer region D to transfer the wafer W to a predetermined unit in the first block G1, the second block G2, the third block G3 and the fourth block G4 therearound. A plurality of the wafer transfer apparatuses 70 are arranged, for example, one above the other as illustrated in FIG. 3 and can transfer the wafers W, for example, to predetermined units in the blocks G1 to G4 at about the same levels as them.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W to transfer the wafer W between the delivery unit 52 in the third block G3 and the delivery unit 62 in the fourth block G4.

As illustrated in FIG. 1, a wafer transfer apparatus 90 is provided on the X-direction positive direction side of the third block G3. The wafer transfer apparatus 90 has a transfer arm that is movable, for example, in the forward and backward direction, the θ-direction, and the vertical direction. The wafer transfer apparatus 90 can move up and down while supporting the wafer W to transfer the wafer W to each of the delivery units in the third block G3.

In the interface station 5, a wafer transfer apparatus 100 is provided. The wafer transfer apparatus 100 has a transfer arm that is movable, for example, in the forward and backward direction, the θ-direction, and the vertical direction. The wafer transfer apparatus 100 can transfer the wafer W to/from each of the delivery units in the fourth block G4 and the exposure apparatus 4 while supporting the wafer W by the transfer arm.

Next, the configuration of the above-described developing treatment unit 30 will be described.

Figure 4:
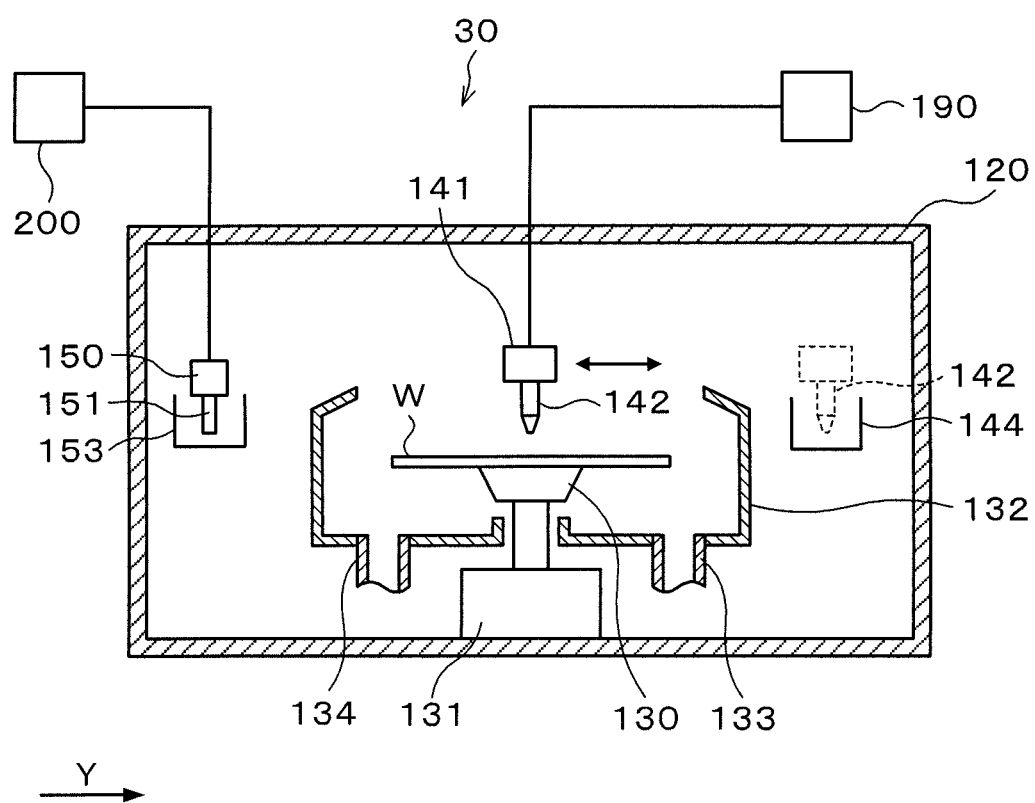
FIG. 4 An explanatory view of a longitudinal section illustrating the outline of a configuration of a developing treatment unit.
Figure 5:
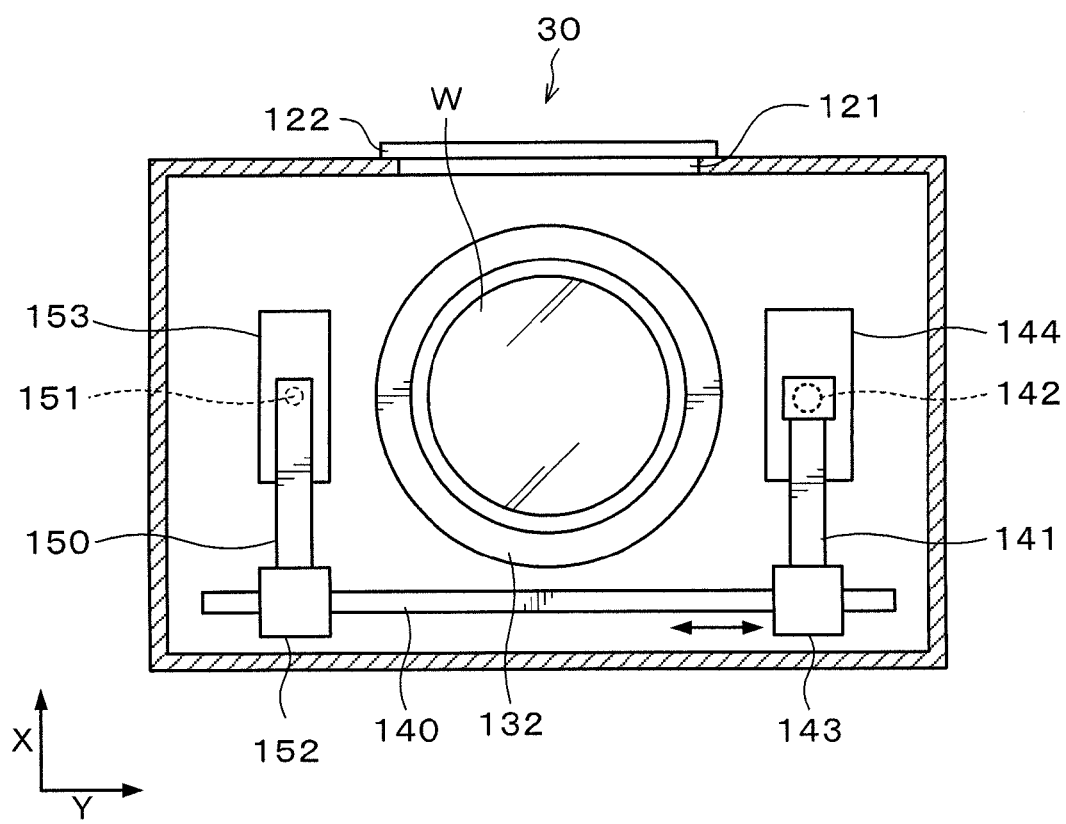
FIG. 5 An explanatory view of a transverse section illustrating the outline of the configuration of the developing treatment unit.

FIG. 4 is an explanatory view of a longitudinal section illustrating the outline of the configuration of the developing treatment unit 30, and FIG. 5 is an explanatory view of a transverse section illustrating the outline of the configuration of the developing treatment unit 30.

The developing treatment unit 30 has a treatment container 120 which can hermetically close the inside as illustrated in FIG. 4. A transfer-in/out port 121 for the wafer W is formed as illustrated in FIG. 5 in a side surface of the treatment container 120 facing the wafer transfer region D for wafer transfer apparatus 70, and an opening/closing shutter 122 is provided at the transfer-in/out port 121.

At a central portion in the treatment container 120, a spin chuck 130 is provided which holds and rotates the wafer W thereon as illustrated in FIG. 4. The spin chuck 130 has a horizontal upper surface and, for example, a suction port (not illustrated) sucking the wafer W is provided in the upper surface. By suction through the suction port, the wafer W can be suction-held on the spin chuck 130.

The spin chuck 130 has a chuck drive mechanism 131 equipped with, for example, a motor and can rotate at a predetermined speed by means of the chuck drive mechanism 131. Further, the chuck drive mechanism 131 is provided with a raising and lowering drive source such as a cylinder so that the spin chuck 130 can freely move up and down.

Around the spin chuck 130, a cup 132 is provided which receives and collects liquid splashing or dropping from the wafer W. A drain pipe 133 that drains the collected liquid and an exhaust pipe 134 that exhausts the atmosphere in the cup 132 are connected to the lower surface of the cup 132.

As illustrated in FIG. 5, on an X-direction negative direction (a lower direction in FIG. 5) side of the cup 132, a rail 140 extending along a Y-direction (a right and left direction in FIG. 5) is formed. The rail 140 is formed, for example, from a Y-direction negative direction (a left direction in FIG. 5) side outer position of the cup 132 to a Y-direction positive direction (a right direction in FIG. 5) side outer position. To the rail 140, an arm 141 is attached.

On the arm 141, a developing solution nozzle 142 as a supply nozzle is supported which discharges a developing solution to the substrate as illustrated in FIG. 4 and FIG. 5. The arm 141 is movable on the rail 140 by means of a nozzle drive part 143 illustrated in FIG. 5. Thus, the developing solution nozzle 142 can move from a waiting section 144 provided at the Y-direction positive direction side outer position of the cup 132 to a position above a central portion of the wafer W in the cup 132, and further move in the diameter direction of the wafer W above the front surface of the wafer W. Further, the arm 141 can freely rise and lower by means of the nozzle drive part 143 to be able to adjust the height of the developing solution nozzle 142. The developing solution nozzle 142 is connected to a developing solution supply apparatus 190 as a treatment solution supply apparatus as illustrated in FIG. 4.

Further, to the rail 140, another arm 150 is attached. On the another arm 150, a pure water nozzle 151 is supported which supplies pure water as a treatment solution. The another arm 150 is movable on the rail 140 by means of a nozzle drive part 152 illustrated in FIG. 5 and can move the pure water nozzle 151 from a waiting section 153 provided at a Y-direction negative direction side outer position of the cup 132 to a position above a central portion of the wafer W in the cup 132. Further, the another arm 150 can freely rise and lower by means of the nozzle drive part 152 to be able to adjust the height of the pure water nozzle 151. The pure water nozzle 151 is connected to a pure water supply apparatus 200 as a treatment solution supply apparatus as illustrated in FIG. 4.

Figure 6:
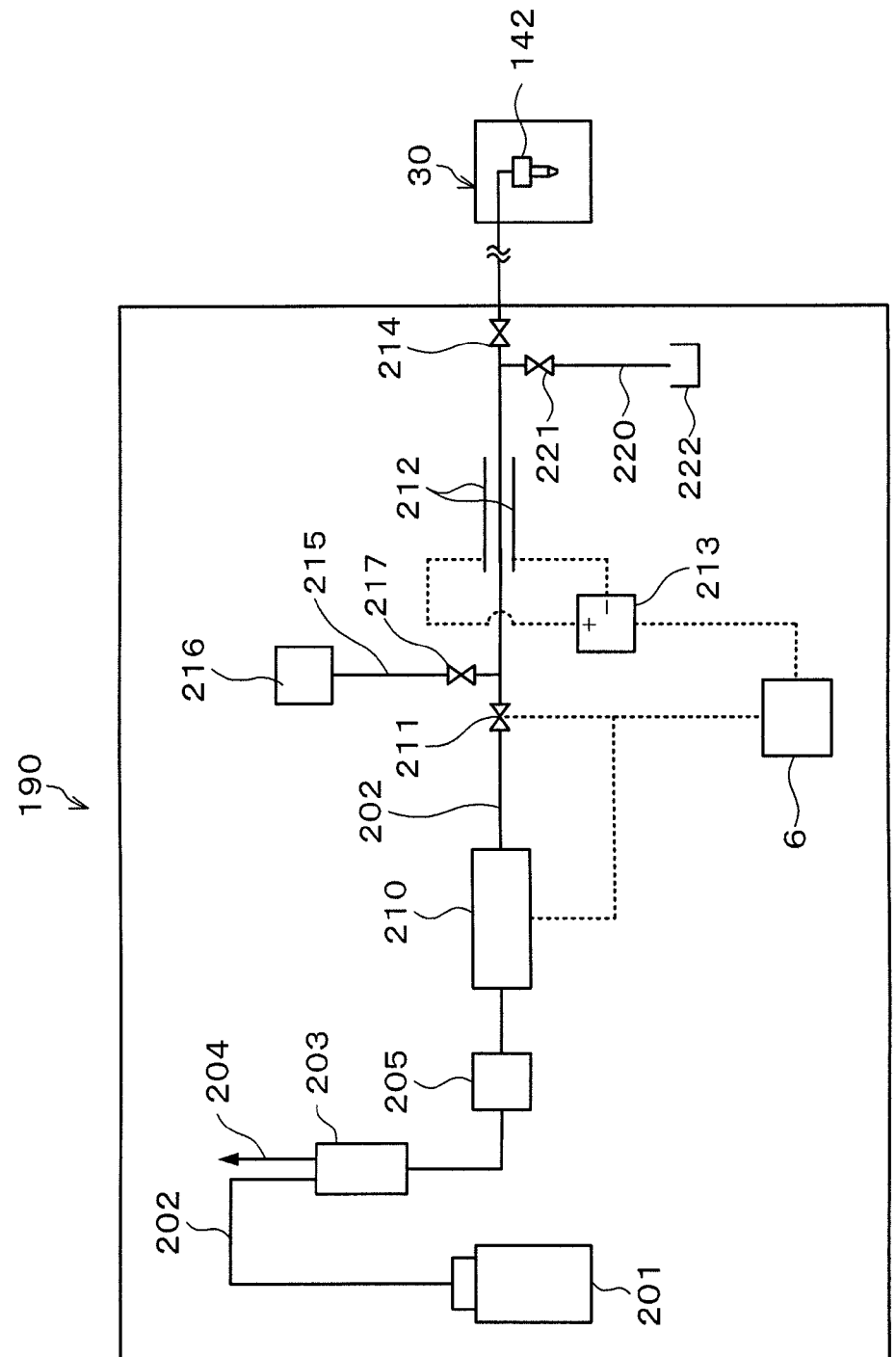
FIG. 6 An explanatory view illustrating the outline of a configuration of a developing solution supply apparatus.

Next, the configuration of the developing solution supply apparatus 190 that supplies a developing solution as a treatment solution to the developing solution nozzle 142 in the developing treatment unit 30 will be described. FIG. 6 is an explanatory view illustrating the outline of the configuration of the developing solution supply apparatus 190. Note that the developing solution supply apparatus 190 is provided, for example, in the chemical box 34 illustrate in FIG. 2.

The developing solution supply apparatus 190 has a developing solution storage tank 201 as a treatment solution supply source that stores a developing solution. The developing solution storage tank 201 is provided with a developing solution supply pipe 202 for supplying the developing solution to the developing solution nozzle 142. More specifically, the developing solution supply pipe 202 is provided while connecting the developing solution storage tank 201 and the developing solution nozzle 142.

The developing solution supply pipe 202 downstream side of the developing solution storage tank 201 is provided with a liquid end tank 203 that temporarily stores the developing solution. At an upper portion of the liquid end tank 203, an exhaust pipe 204 that exhausts the atmosphere in the liquid end tank 203 is provided. The liquid end tank 203 serves as a buffer tank so that even when the developing solution to be supplied from the developing solution storage tank 201 runs out, the developing solution stored in the liquid end tank 203 can be supplied to the developing solution nozzle 142.

The developing solution supply pipe 202 downstream side of the liquid end tank 203 is provided with a filter 205 that removes foreign substances in the developing solution. The filter 205 can remove foreign substances of micrometer order contained in the developing solution.

The developing solution supply pipe 202 downstream side of the filter 205 is provided with a pump 210 that pressure-feeds the developing solution from the developing solution storage tank 201 to the developing solution nozzle 142 as illustrated in FIG. 6. For the pump 210, for example, a tubephragm-type pump is used. The developing solution supply pipe 202 downstream side of the pump 210 is provided with a valve 211. For the valve 210, for example, an air-operation valve is used.

Figure 7:
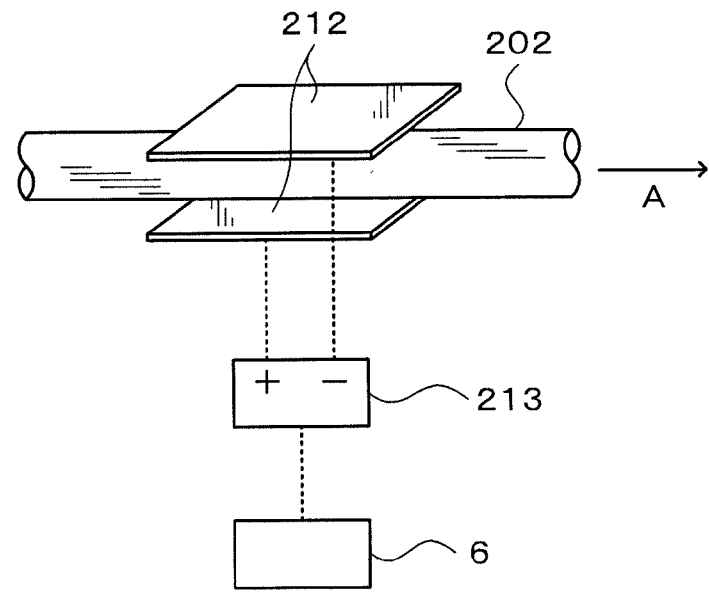
FIG. 7 An explanatory view illustrating the outline of the arrangement of electrodes.

The developing solution supply pipe 202 downstream side of the valve 211 is provided with electrodes 212 that apply a DC voltage to the developing solution in the developing solution supply pipe 202. The electrodes 212 are each formed, for example, in a flat plate shape and arranged to face each other with the developing solution supply pipe 202 intervening therebetween along a flow direction A of the developing solution outside the developing solution supply pipe 202, for example, as illustrated in FIG. 7. To the electrodes 212, a power supply unit 213 is connected which applies the DC voltage to the electrodes 212. The power supply unit 213 can start and stop of application of voltage to the electrodes 212 and reversal of the polarity of the voltage to be applied. Note that in the electrodes 212, the surfaces facing each other with the developing solution supply pipe 202 intervening therebetween of the electrodes 212 only need to be made of a conductive material and other parts thereof may be covered with, for example, an insulating material. Further, a valve 214 is provided downstream side of the electrodes 212. The valve 214 is an air-operation valve similarly to the valve 211.

To a position upstream side of the electrodes 212 and downstream side of the valve 211 along the developing solution supply pipe 202, namely, between the valve 211 and the electrodes 212 along the developing solution supply pipe 202, a cleaning solution supply pipe 215 is connected which supplies a cleaning solution to the developing solution supply pipe 202 as illustrated in FIG. 6. To an end portion of the cleaning solution supply pipe 215 opposite to the side on which the developing solution supply pipe 202 is connected, a cleaning solution supply source 216 is connected which supplies the cleaning solution to the cleaning solution supply pipe 215. Note that the cleaning solution in this embodiment is, for example, pure water but, for example, a developing solution or thinner is also usable and arbitrarily selectable depending on the kind of the treatment solution. Further, the cleaning solution supply pipe 215 is provided with a valve 217 that controls the supply of the cleaning solution to the developing solution supply pipe 202. For the valve 217, for example, an air-operation valve is used similarly to the above-described valve 211.

To a position downstream side of the electrodes 212 along the developing solution supply pipe 202, namely, between the electrodes 212 and the developing solution nozzle 142, a waste solution pipe 220 is connected. The waste solution pipe 220 is provided with a valve 221 so that the valve 221 is operated to open when the cleaning solution is supplied from the cleaning solution supply pipe 215 to the developing solution supply pipe 202 to thereby drain, through the waste solution pipe 220, the cleaning solution passed through the position where the electrodes 212 are provided along the developing solution supply pipe 202. For the valve 221, for example, an air-operation valve is used similarly to the above-described valves 211, 217.

At an end portion of the waste solution pipe 220 opposite to the side on which the developing solution supply pipe 202 is connected, a waste solution part 222 is provided so that the cleaning solution is drained from the waste solution pipe 220 to the waste solution part 222.

Note that the pure water supply apparatus 200 has the same configuration as that of the developing solution supply apparatus 190 and therefore its description will be omitted.

The control of the above-described application of the DC voltage to the electrodes 212 by the power supply unit 213, the drive operation of the pump 210, and the opening/closing operation of the valves are control by the control unit 6. The control unit 6 is composed of, for example, a computer having a CPU, a memory and so on and can execute programs stored, for example, in the memory to implement the supply of the developing solution by the developing solution supply apparatus 190 and the developing treatment in the developing treatment unit 30. Note that various programs for implementing the supply of the developing solution by the developing solution supply apparatus 190 and the developing treatment in the developing treatment unit 30 may be the ones which are stored, for example, in a computer-readable storage medium H such as a computer-readable hard disk (HD), flexible disk (FD), compact disk (CD), magneto-optical disk (MO), or memory card, and installed from the storage medium H into the control unit 6.

The substrate treatment system 1 according to this embodiment is configured as described above, and the supply of the developing solution to the developing solution nozzle 142 performed in the developing solution supply apparatus 190 configured as described above and a developing treatment process performed in the developing treatment unit 30 will be described next together with a process of wafer treatment performed in the whole substrate treatment system 1.

In the treatment of the wafer W, first, a cassette C housing a plurality of wafers W therein is mounted on a predetermined mounting plate 13 in the cassette station 2. Then, the wafers W in the cassette C are sequentially taken out by the wafer transfer apparatus 21 and transferred, for example, to the delivery unit 53 in the third block G3 in the treatment station 3.

Then, the wafer W is transferred by the wafer transfer apparatus 70 to the thermal treatment unit 40 in the second block G2 and temperature-regulated. Thereafter, the wafer W is transferred by the wafer transfer apparatus 70, for example, to the lower anti-reflection film forming apparatus 31 in the first block G1, in which a lower anti-reflection film is formed on the wafer W. The wafer W is then transferred to the thermal treatment unit 40 in the second block G2 and subjected to heat treatment. The wafer W is then returned back to the delivery unit 53 in the third block G3.

Then, the wafer W is transferred by the wafer transfer apparatus 90 to the delivery unit 54 in the same third block G3. Thereafter, the wafer W is transferred by the wafer transfer apparatus 70 to the adhesion unit 41 in the second block G2 and subjected to a hydrophobic treatment. The wafer W is then transferred by the wafer transfer apparatus 70 to the resist coating unit 32.

After the resist film is formed on the wafer W in the resist coating unit 32, the wafer W is transferred by the wafer transfer apparatus 70 to the thermal treatment unit 40 and subjected to pre-baking. The wafer W is then transferred by the wafer transfer apparatus 70 to the delivery unit 55 in the third block G3.

Then, the wafer W is transferred by the wafer transfer apparatus 70 to the upper anti-reflection film forming apparatus 33, in which an upper anti-reflection film is formed on the wafer W. The wafer W is then transferred by the wafer transfer apparatus 70 to the thermal treatment unit 40, and heated and temperature-regulated. The wafer W is then transferred to the edge exposure unit 42 and subjected to edge exposure processing.

The wafer W is then transferred by the wafer transfer apparatus 70 to the delivery unit 56 in the third block G3. The wafer W is then transferred by the wafer transfer apparatus 90 to the delivery unit 52 and transferred by the shuttle transfer apparatus 80 to the delivery unit 62 in the fourth block G4. The wafer W is then transferred by the wafer transfer apparatus 100 in the interface station 5 to the exposure apparatus 4 and subjected to exposure processing.

The wafer W is then transferred by the wafer transfer apparatus 100 to the delivery unit 60 in the fourth block G4. The wafer W is then transferred by the wafer transfer apparatus 70 to the thermal treatment unit 40 and subjected to post-exposure baking. The wafer W is then transferred by the wafer transfer apparatus 70 to the developing treatment unit 30 and developed. Note that the developing treatment in the developing treatment unit 30 will be described later. After the development is finished, the wafer W is transferred by the wafer transfer apparatus 70 to the thermal treatment unit 40 and subjected to post-baking treatment.

Thereafter, the wafer W is transferred by the wafer transfer apparatus 70 to the delivery unit 50 in the third block G3, and then transferred by the wafer transfer apparatus 21 in the cassette station 2 to the cassette C on the predetermined mounting plate 13. Thus, a series of photolithography process ends, and this process is repeatedly performed.

Next, a series of developing treatment of supplying the developing solution from the developing solution supply apparatus 190 to the developing solution nozzle 142 of the developing treatment unit 30 and supplying the developing solution to the wafer W in the developing treatment unit 30 will be described.

First, prior to the developing treatment, a so-called pre-wet treatment is performed. For performing the pre-wet treatment, the pure water nozzle 151 at the waiting section 153 is first moved by the another arm 150 to above the wafer W. Then, pure water is supplied from the pure water nozzle 151, and the wafer W is subjected to pre-wet treatment.

Next, the control unit 6 opens the valves 211, 214 and pressurizes the inside of the developing solution storage tank 201. Thus, the developing solution is pressure-fed from the developing solution storage tank 201 to the liquid end tank 203 and temporarily stored in the liquid end tank 203. When a predetermined amount of the developing solution is stored in the liquid end tank 203, the developing solution flows from the liquid end tank 203 into the developing solution supply pipe 202. Note that in this event, both of the valve 217 of the cleaning solution supply pipe 215 and the valve 221 of the waste solution pipe 220 are closed.

Figure 8:
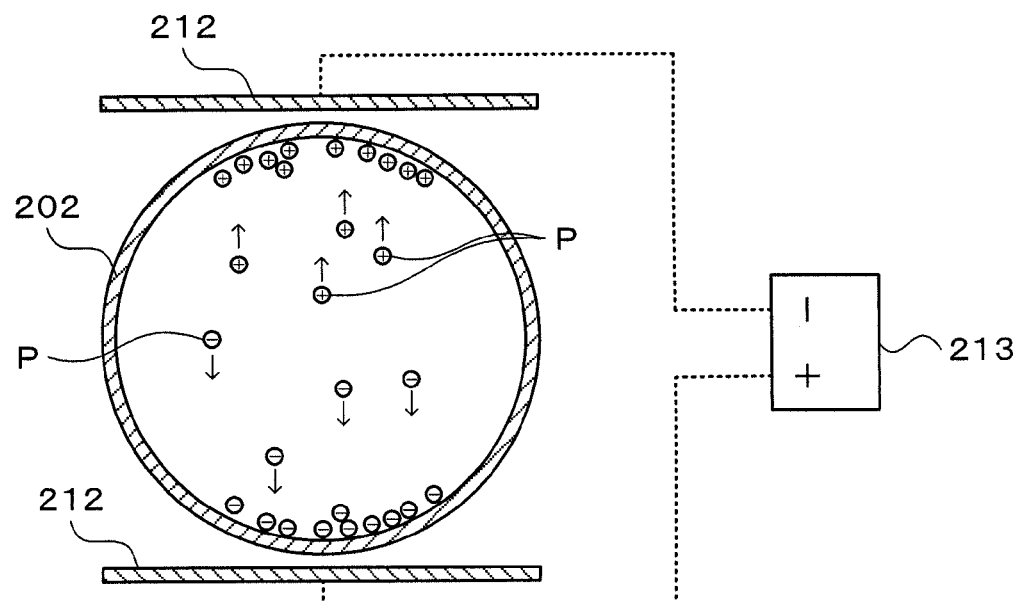
FIG. 8 An explanatory view illustrating the state of fine particles when a voltage is applied to the electrodes.

Next, the control unit 6 operates the power supply unit 213 to apply the DC voltage to the electrodes 212. Thereafter, the pump 210 is operated to supply the developing solution to the wafer W while the voltage is applied to the developing solution flowing through the developing solution supply pipe 202. In this event, fine particles P in the developing solution which could not be removed by the filter 205 are attracted to the electrodes 212 as illustrated in FIG. 8 according to their own charges and collected at positions of the developing solution supply pipe 202 corresponding to the electrodes. This removes the fine particles P from the developing solution.

When the developing solution from which the fine particles P have been removed is supplied to the developing solution nozzle 142, the wafer W sucked on the spin chuck 130 is rotated by the chuck drive mechanism 131 in the developing treatment unit 30, and the developing solution is supplied from the developing solution nozzle 142 to the wafer W. The developing solution supplied to the wafer W is diffused over the entire front surface of the wafer W by the centrifugal force generated by the rotation of the wafer W. Thereafter, the rotation of the wafer W is stopped and the developing treatment is performed.

Further, after the finish of drip of the developing solution from the developing solution nozzle 142 to the wafer W, the control unit 6 closes the valves 211, 214 of the developing solution supply pipe 202, and opens the valve 217 of the cleaning solution supply pipe 215 and the valve 221 of the waste solution pipe 220.

Figure 9:
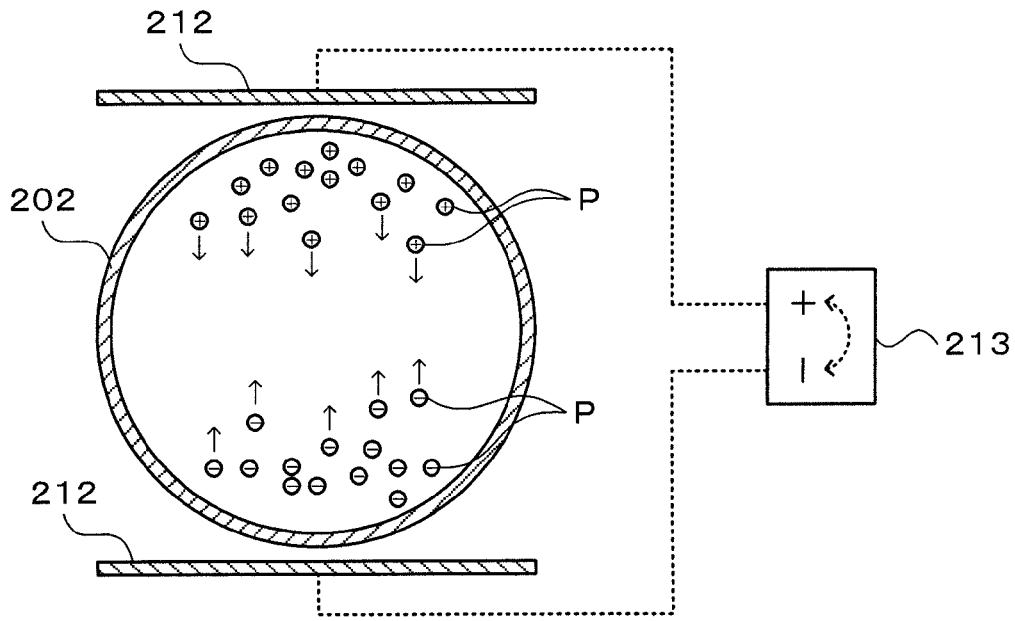
FIG. 9 An explanatory view illustrating the state of fine particles when a voltage is applied to the electrodes.
Figure 9:

Thereafter, the control unit 6 reverses the polarity of the DC voltage applied to the electrodes 212 by the power supply unit 213 to release the fine particles P attracted to the electrodes 212, for example, as illustrated in FIG. 9. Then, the cleaning solution is supplied from the cleaning solution supply source 216 to the developing solution supply pipe 202. The cleaning solution supplied to the developing solution supply pipe 202 is drained from the waste solution pipe 220 together with the fine particles P released from the electrodes 212. This cleans the inside of the developing solution supply pipe 202, and this cleaning is performed continuously for a predetermined period of time. The period of time for which the cleaning is continued is determined on the basis of the result of a preliminary test performed beforehand. Note that since the fine particles P have charges, for example, a conductivity meter may be provided at the waste solution pipe 220 or the waste solution part 222 to measure the conductivity of the cleaning solution so that the cleaning is stopped when the conductivity becomes a predetermined value or less. Further, the cleaning in the developing solution supply pipe 202 does not always need to be performed every supply of the developing solution, and the frequency of the cleaning may be determined on the basis of the result of a preliminary test performed beforehand.

In parallel to the cleaning in the developing solution supply pipe 202, pure water is supplied from the pure water nozzle 151 to the wafer W to wash away the developing solution on the wafer W. Note that what is supplied from the pure water nozzle 151 is pure water from which fine particles P have been removed by the pure water supply apparatus 200 similarly to the developing solution. Thereafter, the supply of the pure water is stopped, and the pure water nozzle 151 retreats to the waiting section 153, and the wafer W is rotated at a predetermined number of rotations for a predetermined time for spin drying. Thereafter, the wafer W is transferred from the developing treatment unit 30 by a transfer mechanism (not illustrated).

On the other hand, when the cleaning in the developing solution supply pipe 202 is completed, the control unit 6 closes the valves 217, 221 and then opens again the valves 211, 214 of the developing solution supply pipe 202. Then, a new wafer W is transferred into the developing treatment unit 30, and a series of developing treatment is repeatedly performed.

According to the above embodiment, the application of the DC voltage to the electrodes 212 provided along the developing solution supply pipe 202 enables removal of the fine particles P which cannot be removed by the filter 205. Thereafter, the polarity of the DC voltage to be applied to the electrodes 212 is reversed to release the fine particles P into the developing solution supply pipe 202 and, in this state, the cleaning solution is supplied into the developing solution supply pipe 202, so that the fine particles P collected by the electrodes 212 can be quickly drained to the outside of the system of the developing solution supply pipe 202. Thus, the inside of the developing solution supply pipe 202 can be kept clean. Consequently, according to this embodiment, fine particles P of about several tens of nanometers which have been difficult to remove by the conventional filter 205 can be removed from the developing solution, and clogging never occurs in the developing solution supply pipe 202, unlike the conventional filter, thereby facilitating maintenance. This enables efficient removal of the fine particles P.

Further, since the electrodes 212 are arranged outside the developing solution supply pipe 202, the electrodes 212 are never corroded. Furthermore, an increase in pressure loss inside the developing solution supply pipe 202 caused by installation of the electrodes 212 does not occur, and the motive power of the pump 210 thus never increases.

Figure 10:
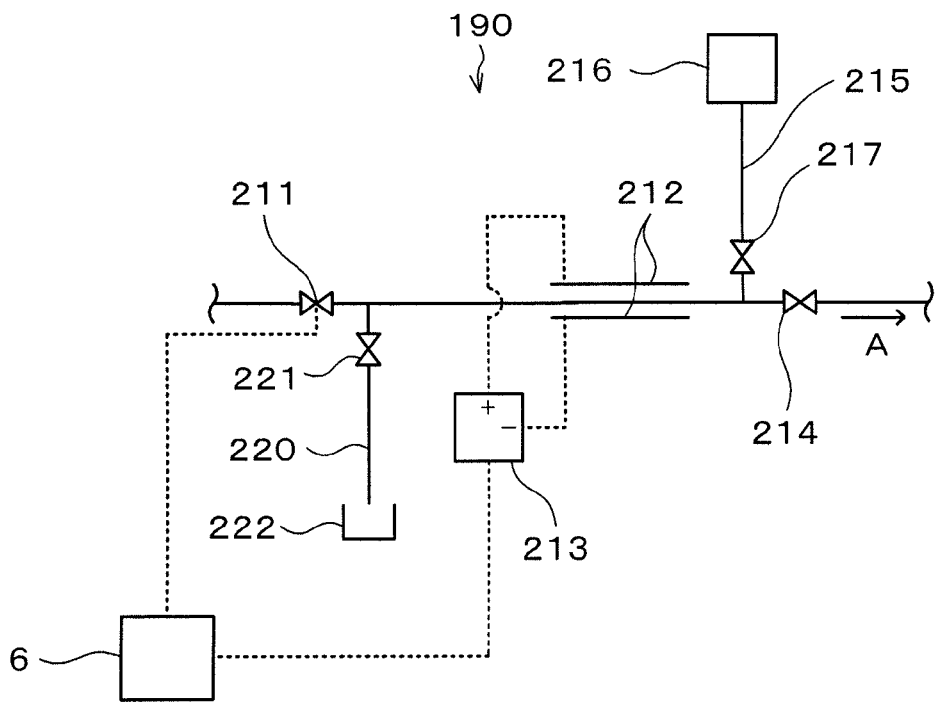
FIG. 10 An explanatory view illustrating the outline of a configuration of a developing solution supply apparatus according to another embodiment.

Note that the cleaning solution supply pipe 215 is provided upstream side of the electrodes 212 and the waste solution pipe 220 is provided downstream side of the electrodes 212 in the above embodiment but, to the contrary, the cleaning solution supply pipe 215 may be provided downstream side of the electrodes 212 and the waste solution pipe 220 may be provided upstream side of the electrodes 212 as illustrated in FIG. 10. In this case, since the cleaning solution flows from the developing solution nozzle 142 toward the electrodes 212, the fine particles P released from the electrodes 212 by reversing the polarity of the voltage applied to the electrodes 212 never remain at a part between the electrodes 212 and the developing solution nozzle 142 along the developing solution supply pipe 202. Further, even if the fine particles P stay in a region between the point where the waste solution pipe 220 joins with the developing solution supply pipe 202 and the valve 211 during cleaning, the staying fine particles P can be collected again by the electrodes 212 during the next developing treatment. Accordingly, the fine particles P can be more surely removed.

Figure 11:
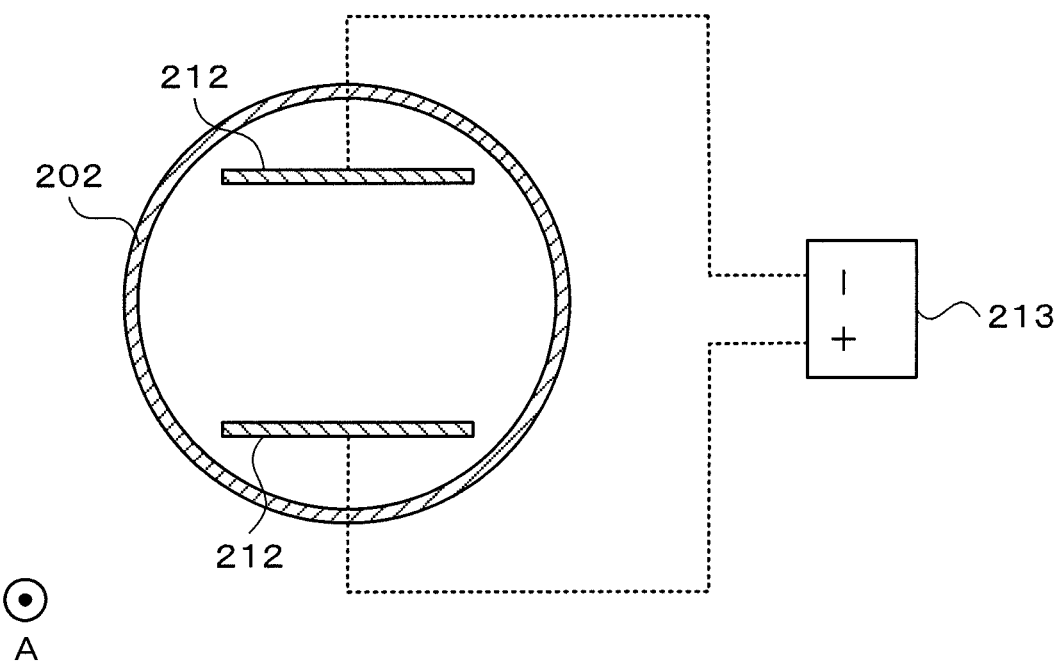
FIG. 11 An explanatory view illustrating the outline of the arrangement of electrodes according to another embodiment.
Figure 12:
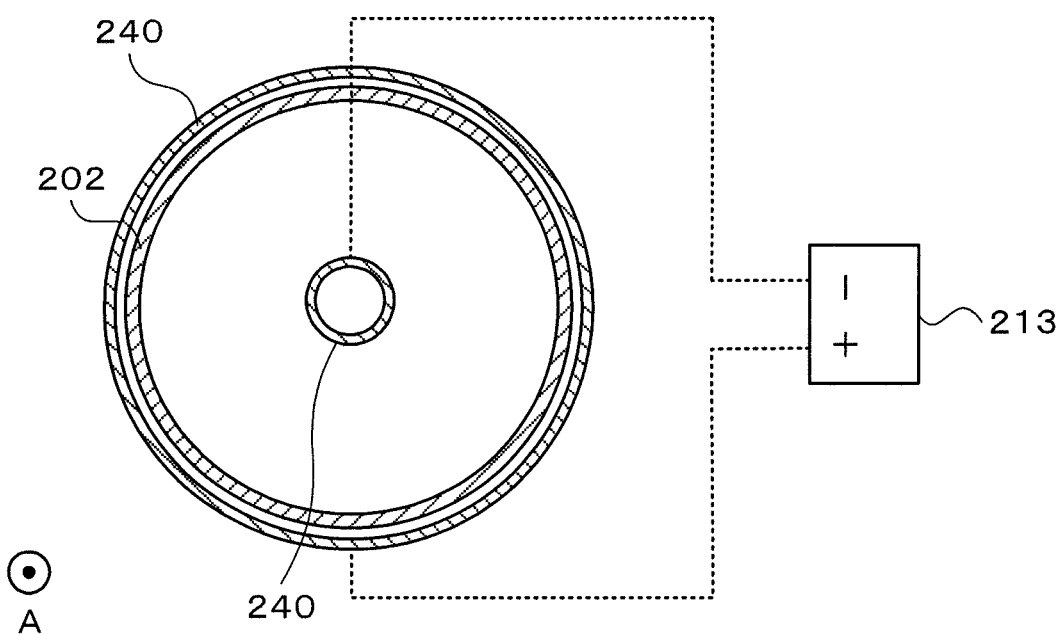
FIG. 12 An explanatory view illustrating the outline of the arrangement of electrodes according to another embodiment.
Figure 13:
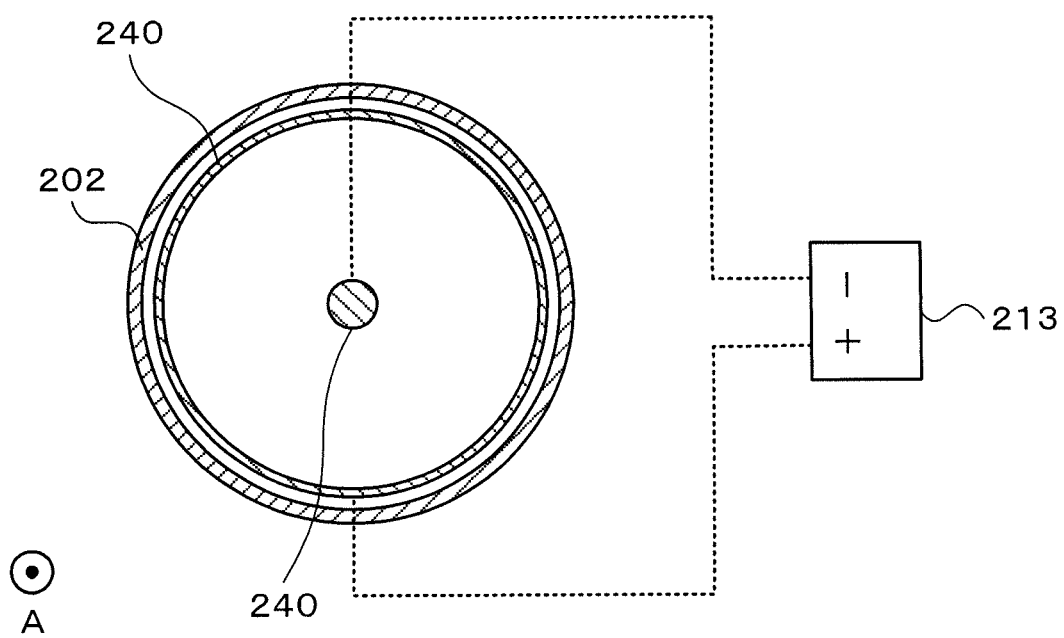
FIG. 13 An explanatory view illustrating the outline of the arrangement of electrodes according to another embodiment.

Note that though the electrodes 212 are provided outside the developing solution supply pipe 202 in the above embodiment, at least one of positive and negative electrodes of the electrodes 212 may be provided inside the developing solution supply pipe 202 or both of positive and negative electrodes of the electrodes 212 may be provided inside the developing solution supply pipe 202 along the flow direction A of the developing solution as illustrated, for example, in FIG. 11. Further, electrodes 240 concentric with the central axis of the developing solution supply pipe 202, namely, concentric with respect to the developing solution supply pipe 202 in a cross section as seen from a direction vertical to the flow direction A of the developing solution may be arranged as illustrated, for example, in FIG. 12. Note that though FIG. 12 illustrates a state that one of positive and negative electrodes of the electrodes 240 is concentrically arranged inside the developing solution supply pipe 202 and the other electrode is concentrically arranged outside the developing solution supply pipe 202, both of the positive and negative electrodes may be concentrically provided inside the developing solution supply pipe 202. Further, the electrodes 240 may be arranged as illustrated, for example, in FIG. 13 such that one of positive and negative electrodes which is formed in a shaft shape is arranged at the position of the central axis of the developing solution supply pipe 202 and the other electrode is arranged concentric with the central axis of the developing solution supply pipe 202.

Furthermore, the developing solution supply pipe 202 may be formed of a conductive material and the developing solution supply pipe 202 itself may be used as one of the positive and negative electrodes, and the arrangement and the shapes of the electrodes are not limited to those in the above-described embodiment. It should be understood that various changes and modifications are readily apparent to those skilled in the art within the scope of the spirit as set forth in claims, and those should also be covered by the technical scope of the present invention.

Figure 14:
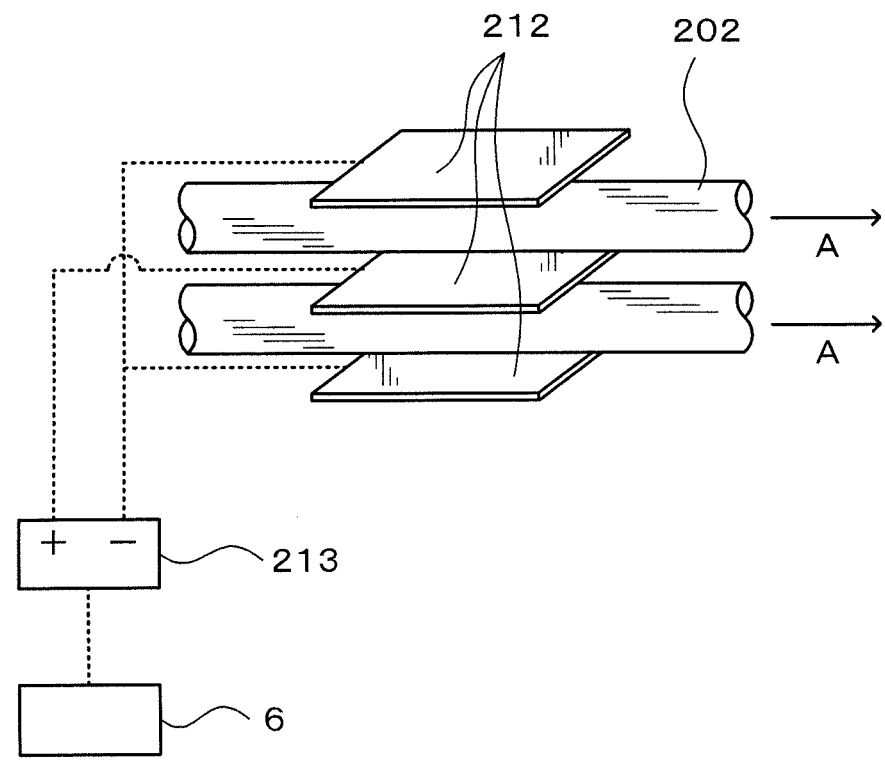
FIG. 14 An explanatory view illustrating the outline of the arrangement of electrodes according to another embodiment.

Though the case where one developing solution supply pipe 202 is provided in the developing solution supply apparatus 190 has been described in the above embodiment, for example, a plurality of developing solution nozzles 142 and developing solution supply pipes 202 are provided in some cases. In this case, the plurality of developing solution supply pipes 202 are arranged in parallel to each other, and positive electrodes and negative electrodes of the electrodes 212 each in a flat plate shape may be arranged alternately to face each other between the developing solution supply pipes 202 adjacent to each other, in other words, the positive electrodes and negative electrodes of the electrodes 212 may be alternately arranged in a manner to hold each of the developing solution supply pipes 202 therebetween as illustrated, for example, in FIG. 14. In this case, since the electrode 212 arranged between the developing solution supply pipes 202 can be used in common between the adjacent developing solution supply pipes 202, thereby minimizing the installation space for the electrodes.

Note that the cleaning solution supplied to the developing solution supply pipe 202 via the cleaning solution supply pipe 215 is drained from the waste solution pipe 220 in the above embodiment, but the waste solution pipe 220 does not always need to be provided. The cleaning solution may be supplied to the developing solution supply pipe 202 with the developing solution nozzle 142 moved to the waiting section 144, and the cleaning solution may be drained from the developing solution nozzle 142 to the waiting section 144. In this case, the space for providing the waste solution pipe 220 becomes unnecessary.

Though the fine particles P attracted to the electrodes 212 are released by reversing the polarity of the DC voltage applied to the electrodes 212 in the above embodiment, the fine particles P may be released by simply stopping the application of the voltage instead of reversing the polarity. Further, the fine particles P may be released from the electrodes 212 by reversing the polarity of the voltage applied to the electrodes 212 for a predetermined time, and the application of the voltage may be stopped before the released fine particles P are collected again by the electrodes 212. The application and stop of the voltage to the electrodes 212 can be arbitrarily set according to the arrangement and size of the electrodes 212.

Note that the electrode is in a plate shape or cylindrical shape in the above embodiment, the shape of the electrode is not limited to these examples but can be arbitrarily set according to the arrangement and size of the developing solution supply pipe 202. For example, to enhance the collection efficiency of the fine particles P by the electrodes by increasing the contact area between the developing solution and the electrode, the electrode may be formed in a mesh shape.

Figure 15:
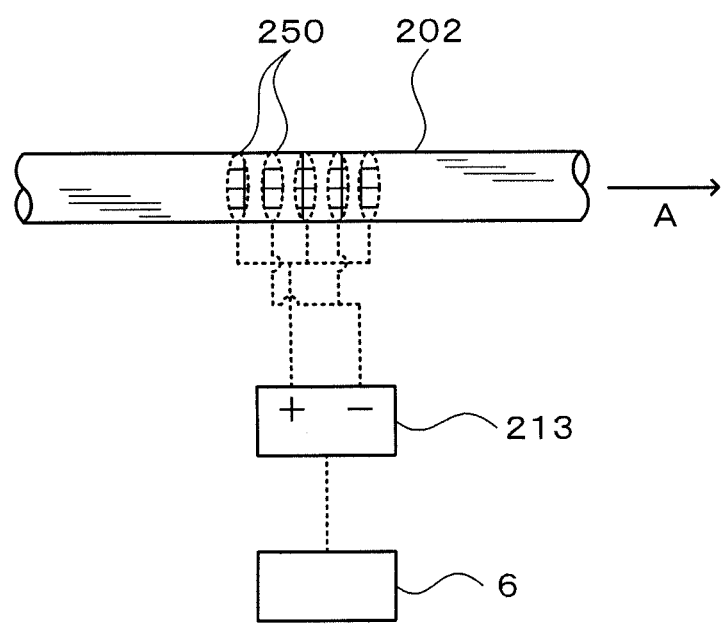
FIG. 15 An explanatory view illustrating the outline of the arrangement of electrodes according to another embodiment.

In the case of using the electrode in the mesh shape, each of electrodes 250 is formed in a mesh plate shape having a shape similar to a cross section perpendicular to the flow direction A of the developing solution supply pipe 202 and a plurality of positive electrodes and negative electrodes of the electrodes 250 may be arranged alternately with respect to the flow direction A in the developing solution supply pipe 202 as illustrated, for example, in FIG. 15. Thus, the developing solution flows in the developing solution supply pipe 202 in a manner to cross the faces of the electrodes 250 perpendicularly, so that the fine particles P can be efficiently removed by the electrodes 250.

Especially in the case of using the electrodes 250, the numbers of meshes of the electrodes 250 are decreased, for example, in order from the upstream to the downstream of the developing solution supply pipe 202, whereby occurrence of clogging of the electrodes 250 can be suppressed. In this case, the cleaning solution supply pipe 215 is provided downstream side of the electrodes 250 and the waste solution pipe 220 is provided upstream side of the electrodes 250. This makes it possible to form the flow of the cleaning solution directing from a fine mesh to a coarse mesh to thereby efficiently remove the fine particles P collected by the electrodes 250.

Figure 16:
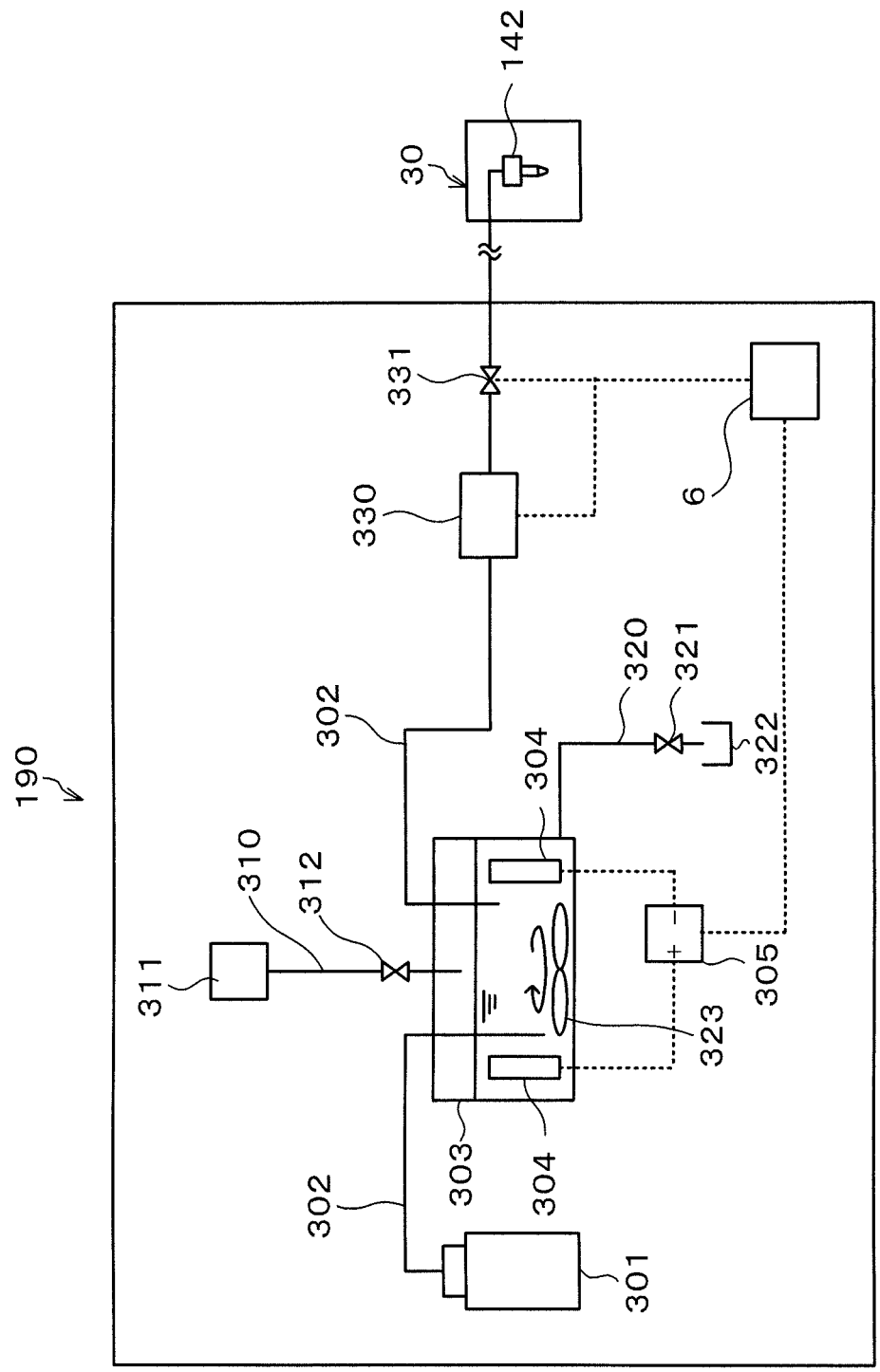
FIG. 16 An explanatory view illustrating the outline of a configuration of a developing solution supply apparatus according to another embodiment.

Next, a configuration of a developing solution supply apparatus 190 according to another embodiment in which the developing solution as the treatment solution is supplied to the developing solution nozzle 142 in the developing treatment unit 30 will be described. FIG. 16 is an explanatory view illustrating the outline of the configuration of the developing solution supply apparatus 190. Note that the developing solution supply apparatus 190 is provided, for example, in the chemical box 34 illustrated in FIG. 2.

The developing solution supply apparatus 190 has a developing solution storage tank 301 as a treatment solution supply source that stores the developing solution. The developing solution storage tank 301 is provided with a developing solution supply pipe 302 for supplying the developing solution to the developing solution nozzle 142. More specifically, the developing solution supply pipe 302 is provided while connecting the developing solution storage tank 301 and the developing solution nozzle 142.

Between the developing solution storage tank 301 and the developing solution nozzle 142, an intermediate storage tank 303 is provided which temporarily stores the developing solution supplied from the developing solution storage tank 301 via the developing solution supply pipe 302. The intermediate storage tank 303 is formed, for example, in a bottomed cylindrical shape with an upper part open. The intermediate storage tank 303 serves as a buffer tank so that even when the developing solution to be supplied from the developing solution storage tank 301 runs out, the developing solution stored in the intermediate storage tank 303 can be supplied to the developing solution nozzle 142.

Inside the intermediate storage tank 303, electrodes 304 are provided which apply a DC voltage to the developing solution in the intermediate storage tank 303. The electrodes 304 are each formed, for example, in a flat plate shape such that a positive electrode and a negative electrode are arranged separated at a predetermined distance in the intermediate storage tank 303. To the electrodes 304, a power supply unit 305 is connected which applies the DC voltage to the electrodes 304. The power supply unit 305 can start and stop of application of voltage to the electrodes 304 and reversal of the polarity of the voltage to be applied.

At the opening of the upper part of the intermediate storage tank 303, a cleaning solution supply pipe 310 is provided which supplies a cleaning solution into the intermediate storage tank 303 as illustrated in FIG. 16. To an end portion of the cleaning solution supply pipe 310 opposite to the intermediate storage tank 303 side, a cleaning solution supply source 311 is connected which supplies the cleaning solution to the cleaning solution supply pipe 310. Note that the cleaning solution in this embodiment is, for example, pure water but, for example, a developing solution or thinner is also usable and arbitrarily selectable depending on the kind of the treatment solution. Further, the cleaning solution supply pipe 310 is provided with a valve 312 that controls the supply of the cleaning solution to the intermediate storage tank 303. For the valve 312, for example, an air-operation valve is used.

To a lower part of the side surface or at the bottom of the intermediate storage tank 303, more specifically, below the electrodes 304, a waste solution pipe 320 is provided which drains from the intermediate storage tank 303 the cleaning solution supplied from the cleaning solution supply pipe 310. The waste solution pipe 320 is provided with a valve 321 so that the valve 321 is operated to open to thereby drain, through the waste solution pipe 320, the cleaning solution supplied to the intermediate storage tank 303. For the valve 321, for example, an air-operation valve is used similarly to the above-described valve 312. At an end portion of the waste solution pipe 320 opposite to the side on which the intermediate storage tank 303 is connected, a waste solution part 322 is provided so that the cleaning solution is drained from the waste solution pipe 320 to the waste solution part 322.

Further, inside the intermediate storage tank 303, a stirrer 323 as a stirring mechanism is provided which stirs the developing or the cleaning solution stored in the intermediate storage tank 303. The stirrer 323 can form a spiral flow of the developing solution, for example, about the central vertical axis of the intermediate storage tank in the intermediate storage tank 303 to relatively move the developing solution and the electrodes 304.

The developing solution supply pipe 302 downstream side of the intermediate storage tank 303 is provided with a pump 330 that pressure-feeds the developing solution in the intermediate storage tank 303 to the developing solution nozzle 142. For the pump 330, for example, a tubephragm-type pump is used. The developing solution supply pipe 302 downstream side of the pump 330 is provided with a valve 331. For the valve 331, for example, an air-operation valve is used.

Next, a series of developing treatment of supplying the developing solution from the above-described developing solution supply apparatus 190 according to the another embodiment to the developing solution nozzle 142 of the developing treatment unit 30 and supplying the developing solution to the wafer W in the developing treatment unit 30 will be described.

First, prior to the developing treatment, a so-called pre-wet treatment is performed. For performing the pre-wet treatment, the pure water nozzle 151 at the waiting section 153 is first moved by the another arm 150 to above the wafer W. Then, the pure water is supplied from the pure water nozzle 151, and the wafer W is subjected to pre-wet treatment.

Figure 17:
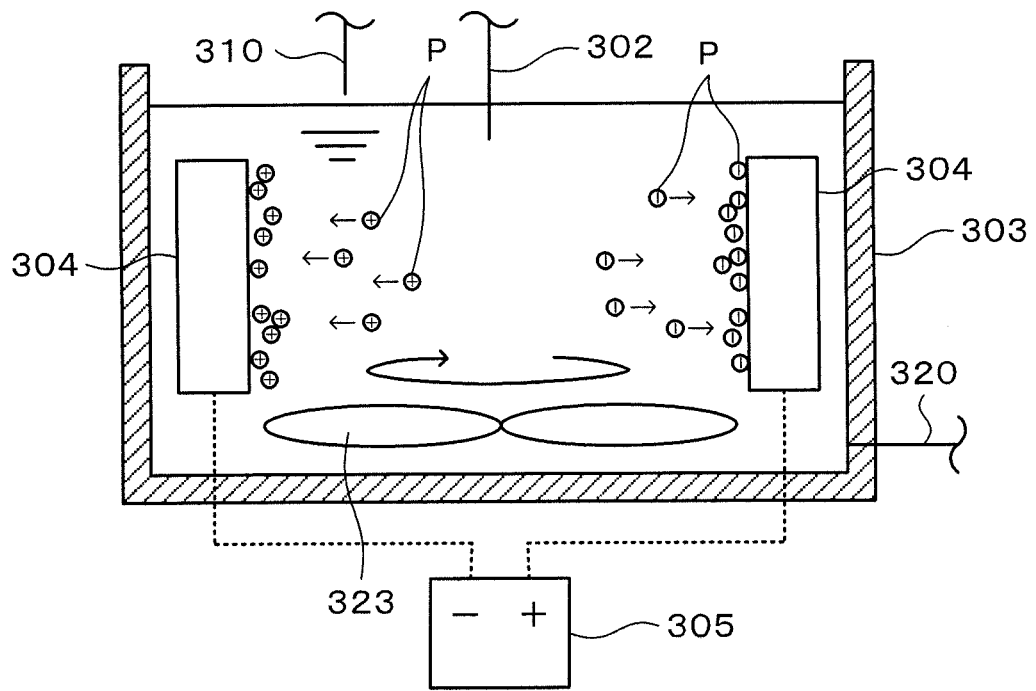
FIG. 17 An explanatory view illustrating the state of fine particles when a voltage is applied to the electrodes.

Next, the control unit 6 opens the valve 331 and pressurizes the inside of the developing solution storage tank 301. Thus, the developing solution is pressure-fed from the developing solution storage tank 301 to the intermediate storage tank 303 and temporarily stored in the intermediate storage tank 303. When a predetermined amount of the developing solution is stored in the intermediate storage tank 303, the control unit 6 then operates the power supply unit 305 to apply the DC voltage to the electrodes 304. Further, concurrently with the application of the voltage to the electrodes 304, the stirrer 323 is operated. This stirs the developing solution in the intermediate storage tank 303, so that the developing solution uniformly comes into contact with the electrodes 304. In this event, the fine particles P in the developing solution which could not be removed by the conventional filter are attracted to and collected by the electrodes 304 according to their own charges as illustrated in FIG. 17. This removes the fine particles P from the developing solution in the intermediate storage tank 303.

Thereafter, the pump 330 is operated to supply the developing solution from which the fine particles P have been removed to the developing solution nozzle 142. Then, the wafer W sucked on the spin chuck 130 is rotated by the chuck drive mechanism 131 in the developing treatment unit 30, and the developing solution is supplied from the developing solution nozzle 142 to the wafer W. The developing solution supplied to the wafer W is diffused over the entire front surface of the wafer W by the centrifugal force generated by the rotation of the wafer W. Thereafter, the rotation of the wafer W is stopped and the developing treatment is performed. Note that after the fine particles P in the developing solution are removed by the electrodes 304, the stirrer 323 may be stopped.

After the finish of drip of the developing solution from the developing solution nozzle 142 to the wafer W, the control unit 6 closes the valve 331 of the developing solution supply pipe 302. Then, the pure water is supplied from the pure water nozzle 151 to the wafer W to wash away the developing solution on the wafer W. Note that what is supplied from the pure water nozzle 151 is pure water from which fine particles P have been removed by the pure water supply apparatus 200 similarly to the developing solution.

Thereafter, the supply of the pure water is stopped, and the pure water nozzle 151 retreats to the waiting section 153, the wafer W is rotated at a predetermined number of rotations for a predetermined time for spin drying. Thereafter, the wafer W is transferred from the developing treatment unit 30 by a transfer mechanism (not illustrated). Then, a new wafer W is transferred into the developing treatment unit 30, and a series of developing treatment is repeatedly performed.

Figure 18:
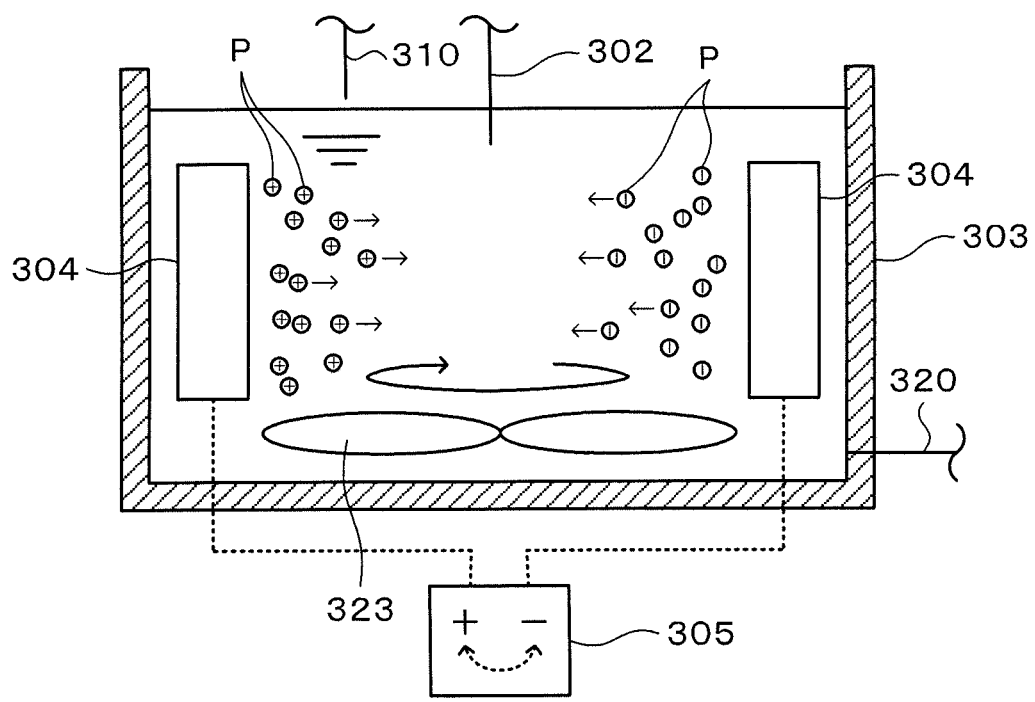
FIG. 18 An explanatory view illustrating the state of fine particles when a voltage is applied to the electrodes.

When the developing treatment is repeatedly performed, the collected fine particles P are accumulated on the surfaces of the electrodes 304. Therefore, the electrodes 304 are cleaned. For the cleaning of the electrodes 304, the stirrer 323 is first stopped, and then the valve 312 of the cleaning solution supply pipe 310 is opened to supply the cleaning solution into the intermediate storage tank 303. Thereafter, the control unit 6 reverses the polarity of the DC voltage applied to the electrodes 304 by the power supply unit 305. This releases the fine particles P attracted to the electrodes 304, into the cleaning solution as illustrated in FIG. 18. Then, the application of the voltage is stopped in order to prevent the fine particles released into the cleaning solution from re-attaching to the electrodes 304.

Thereafter, the control unit 6 opens the valve 321 of the waste solution pipe 320 to drain the cleaning solution containing the fine particles P from the waste solution pipe 320. This cleans the electrodes 304 and the inside of the intermediate storage tank 303, and this cleaning is performed continuously for a predetermined period of time. The period of time for which the cleaning is continued is determined on the basis of the result of a preliminary test performed beforehand. Note that since the fine particles P have charges, for example, a conductivity meter may be provided at the waste solution pipe 320 or the waste solution part 322 to measure the conductivity of the cleaning solution so that the cleaning is stopped when the conductivity becomes a predetermined value or less.

When the cleaning in the intermediate storage tank 303 is finished, the control unit 6 closes the valves 312, 321. Then, the developing solution is supplied again from the developing solution storage tank 301 to the intermediate storage tank 303, and a series of developing treatment is repeatedly performed.

According to the above embodiment, the DC voltage is applied to the electrodes 304 provided in the intermediate storage tank 303 to remove the fine particles P which cannot be removed by the conventional filter and then the polarity of the voltage to be applied to the electrodes 304 is reversed to release the fine particles P from the electrodes 304 and, in this state, the cleaning solution is supplied into the intermediate storage tank 303, so that the fine particles P collected by the electrodes 304 can be quickly drained to the outside of the system of the intermediate storage tank 303. Thus, the inside of the intermediate storage tank 303 can be kept clean. Consequently, according to this embodiment, fine particles P of about several tens of nanometers which have been difficult to remove by the conventional filter can be removed from the developing solution, and clogging never occurs in the developing solution supply pipe 302, unlike the conventional filter, thereby facilitating maintenance. This enables efficient removal of the fine particles P.

Further, since it is unnecessary to provide a filter in the developing solution supply pipe 302, unlike the conventional art, the pressure loss in the developing solution supply pipe 302 can be reduced. Accordingly, the size of the pump 330 can be reduced and its motive power can be reduced.

Further, the electrodes 304 are provided in the intermediate storage tank 303 to remove the fine particles P, thus making it possible to independently perform the discharge operation of the treatment solution such as the developing solution and the removal operation of the fine particles P from the treatment solution, thereby more efficiently removing the fine particles P.

Further, since the stirrer 323 is provided in the intermediate storage tank 303, a stirring flow can be formed in the intermediate storage tank 303. This makes it possible to bring the fine particles P into uniform contact with the electrodes 304 and thereby efficiently remove the fine particles by the electrodes 304 without increasing the size of the electrodes 304.

Note that though the case where the cleaning of the electrodes 304 is performed after the developing treatment is repeated a fixed number of times has been described in the above embodiment, the time for cleaning the electrodes 304 can be arbitrarily set, and the cleaning may be performed, for example, at the time when the liquid level of the developing solution in the intermediate storage tank 303 lowers and the intermediate storage tank 303 is replenished with a developing solution. Further, the cleaning of the electrodes 304 can be performed in various procedures other than that of the above embodiment. For example, it is also adoptable that the polarity of the voltage applied to the electrodes 304 is reversed, then the valve 321 of the waste solution pipe 320 is opened to once drain the fine particles P together with the developing solution remaining in the intermediate storage tank 303, then the valve 321 is closed, then the valve 312 of the cleaning solution supply pipe 310 is opened to clean the electrodes 304, and the valve 321 is opened again to drain the cleaning solution.

Further, when convection of the treatment solution spontaneously occurs in the intermediate storage tank 303 due to the shapes of the intermediate storage tank 303 and the electrodes 304 and the arrangement setting of the developing solution supply pipe 302 and the waste solution pipe 320, the stirrer 323 does not always need to be provided.

Figure 19:
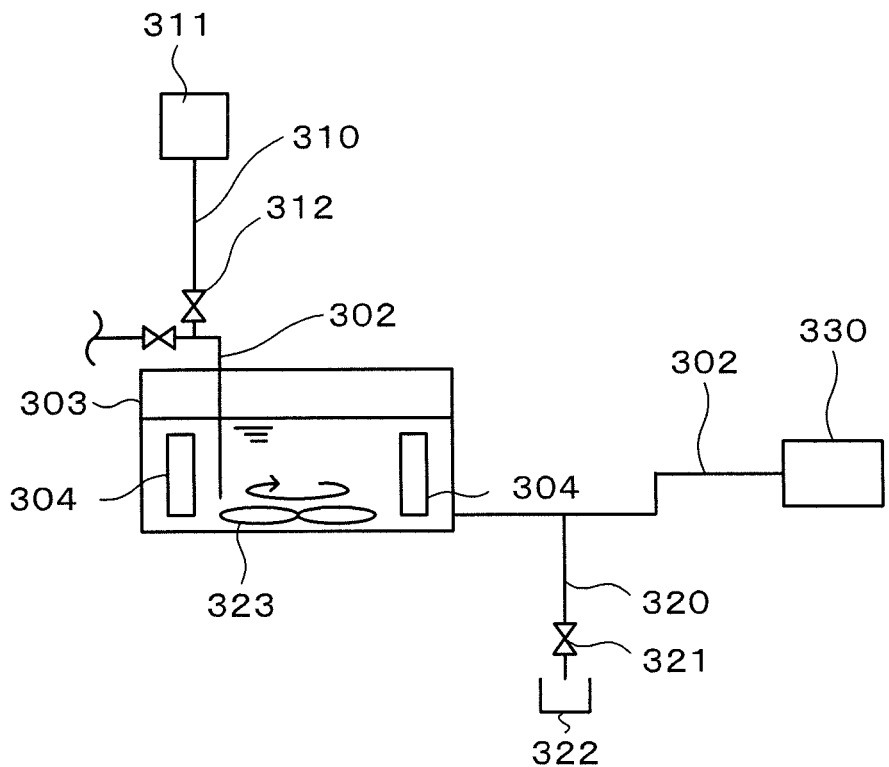
FIG. 19 An explanatory view illustrating the outline of a configuration of a developing solution supply apparatus according to another embodiment.

Note that though the cleaning solution is supplied directly to the intermediate storage tank 303 through the cleaning solution supply pipe 310 in the above embodiment, the cleaning solution supply pipe 310 may be connected to the developing solution supply pipe 302 located upstream side of the intermediate storage tank 303 to supply the cleaning solution via the developing solution supply pipe 302, for example, as illustrated in FIG. 19.

Further, the waste solution pipe 320 may also be connected to the developing solution supply pipe 302 downstream side of the intermediate storage tank 303 to supply the cleaning solution via the developing solution supply pipe 302. In this case, the developing solution supply pipe 302 is provided at a lower part of the side surface or at the bottom of the intermediate storage tank 303 and lower than the electrodes 304 as illustrated in FIG. 19 so that the developing solution or the cleaning solution can be drained from the waste solution pipe 320 by its own weight even if the pump 330 is not operated.

Note that the electrode 304 is in a flat plate shape in the above embodiment, but the shape of the electrode is not limited to this example but can be arbitrarily set according to the size and shape of the intermediate storage tank 303. For example, to enhance the collection efficiency of the fine particles P by the electrodes 304 by increasing the contact area between the developing solution and the electrode 304, the electrode 304 may be formed in a mesh shape.

Figure 20:
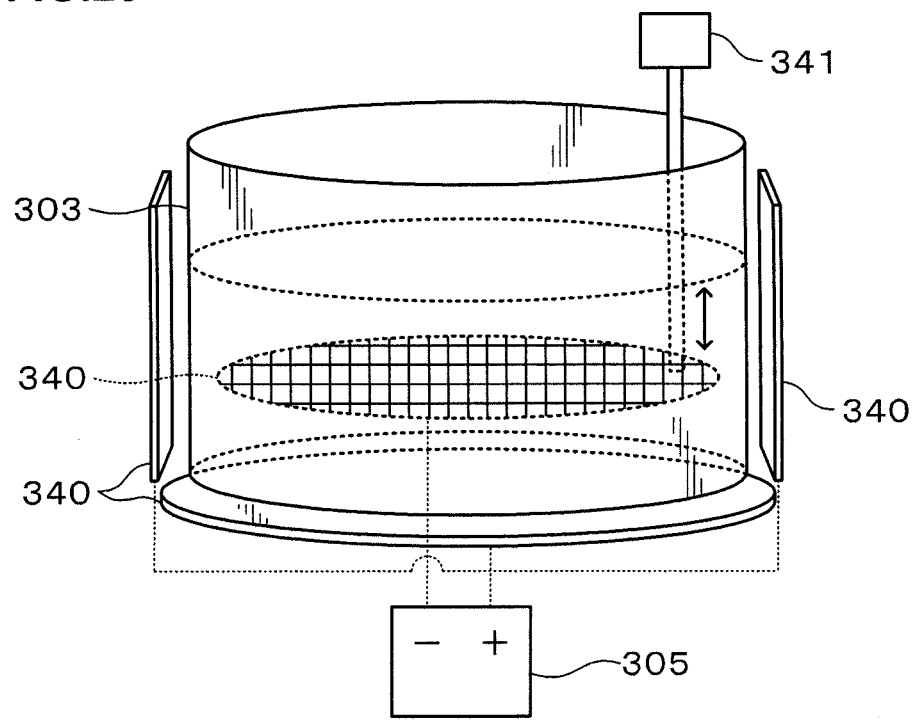
FIG. 20 An explanatory view illustrating the outline of the arrangement of electrodes according to another embodiment.

In the case of using the electrode in the mesh shape, electrodes 304 may be used in which one of positive and negative electrodes is formed in a mesh plate shape in parallel to the bottom surface of the intermediate storage tank 303 and along the shape of the inner surface of the intermediate storage tank 303 as illustrated in FIG. 20. In this case, the other electrode of the electrodes 304 is provided along the shape of the outer surface of the intermediate storage tank 303 and provided outside the intermediate storage tank 303. In the case of using the electrodes 304, a raising and lowering mechanism 341 that raises and lowers the electrode 304 in the vertical direction is provided and serves as a stirring mechanism. Note that only a part of the electrode 340 provided outside the intermediate storage tank 303 is illustrated in FIG. 20 for convenience of illustration.

Further, as another form of the electrode, an electrode 351 in a mesh plate shape may be used which is provided along a rotation shaft 350 provided extending in the vertical direction inside the intermediate storage tank 303. The rotation shaft 350 is formed of a conductive material and configured to be freely rotatable by means of a rotation mechanism 352, along the circumferential direction of the intermediate storage tank 303. In this case, the rotation mechanism 352 functions as a stirring mechanism. The other electrode of the electrode 351 is formed along the shape of the outer surface of the intermediate storage tank 303 similarly to the electrode 340 illustrated in FIG. 20 and is provided outside the intermediate storage tank 303.

Figure 21:
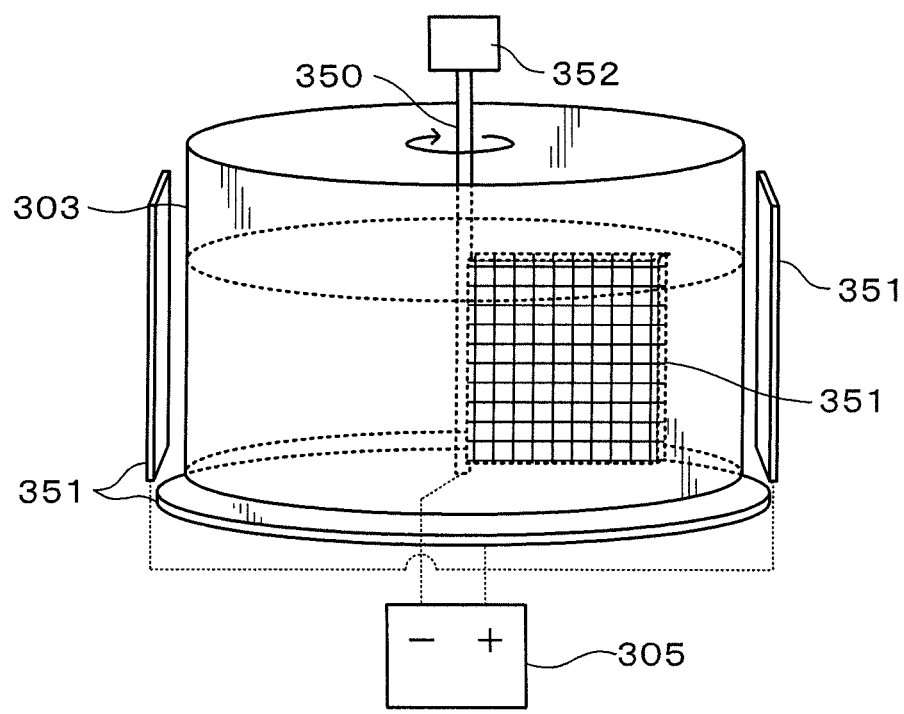
FIG. 21 An explanatory view illustrating the outline of the arrangement of electrodes according to another embodiment.
Figure 22:
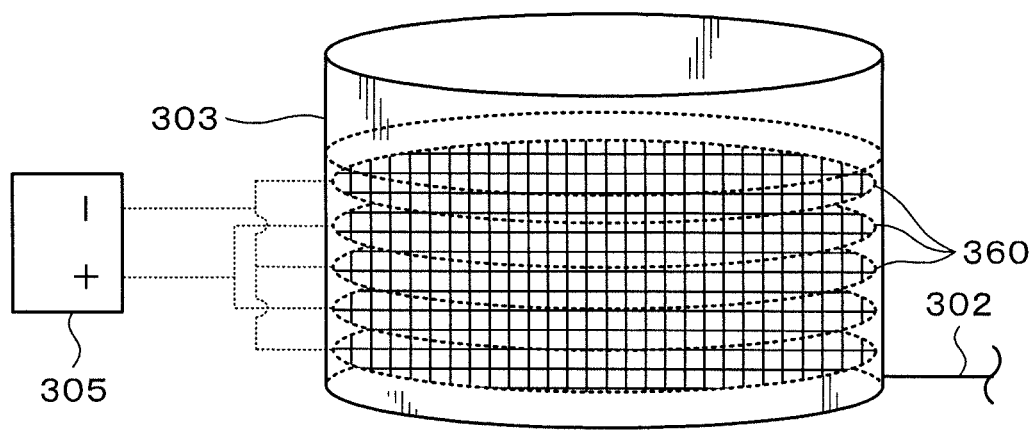
FIG. 22 An explanatory view illustrating the outline of the arrangement of electrodes according to another embodiment.

As illustrated in FIG. 20, FIG. 21, the electrode 340, 351 is formed in a mesh shape and the electrode 340, 351 is moved in the intermediate storage tank 303, whereby the foreign substances in the liquid in the intermediate storage tank 303 can be uniformly removed. In particular, as illustrated in FIG. 20, by using the electrode 340 in a mesh plate shape having a shape similar to the bottom surface of the intermediate storage tank 303, the contact area between the electrode 340 and the developing solution can be kept constant at all times even when the liquid level of the developing solution in the intermediate storage tank 303 lowers, so that the fine particles P can be efficiently removed regardless of the remaining amount of the developing solution in the intermediate storage tank 303. Note that though the electrode 351 provided inside the intermediate storage tank 303 is illustrated to be shorter than the radius of the intermediate storage tank 303 in FIG. 21, the length of the electrode 351 in the diameter direction of the intermediate storage tank 303 can be arbitrarily set.

Further, positive electrodes and negative electrodes of electrodes 360 which are parallel to the bottom surface of the intermediate storage tank 303 and each formed in a mesh plate shape may be arranged alternately along a direction of height of the intermediate storage tank 303 in the intermediate storage tank 303. In this case, the developing solution supply pipe 302 downstream side of the intermediate storage tank 303 is preferably arranged so that the developing solution supplied from the upper portion of the intermediate storage tank 303 is drained after passing through the electrode 360 located at the farthest position. Specifically, the developing solution supply pipe 302 is provided, for example, at a lower part of the side surface or at the bottom of the intermediate storage tank 30. This arrangement makes the developing solution flow to cross the surfaces of the electrodes 360 vertically in the intermediate storage tank 303, thereby making it possible to efficiently remove the fine particles P by the electrodes 360 without providing a stirring mechanism.

Especially in the case of using the electrodes 360, the numbers of meshes of the electrodes 360 are decreased, for example, in order from the top to the bottom of the intermediate storage tank 303, whereby occurrence of clogging of the electrodes 360 can be suppressed. In this case, the cleaning solution supply pipe 310 may be provided at the bottom of the intermediate storage tank 303 and the waste solution pipe 320 may drain the cleaning solution overflowing from above the electrode 360 provided at the uppermost in the intermediate storage tank 303. This makes it possible to form the flow of the cleaning solution directing from a fine mesh to a coarse mesh to thereby efficiently remove the fine particles P collected by the electrodes 360.

Figure 23:
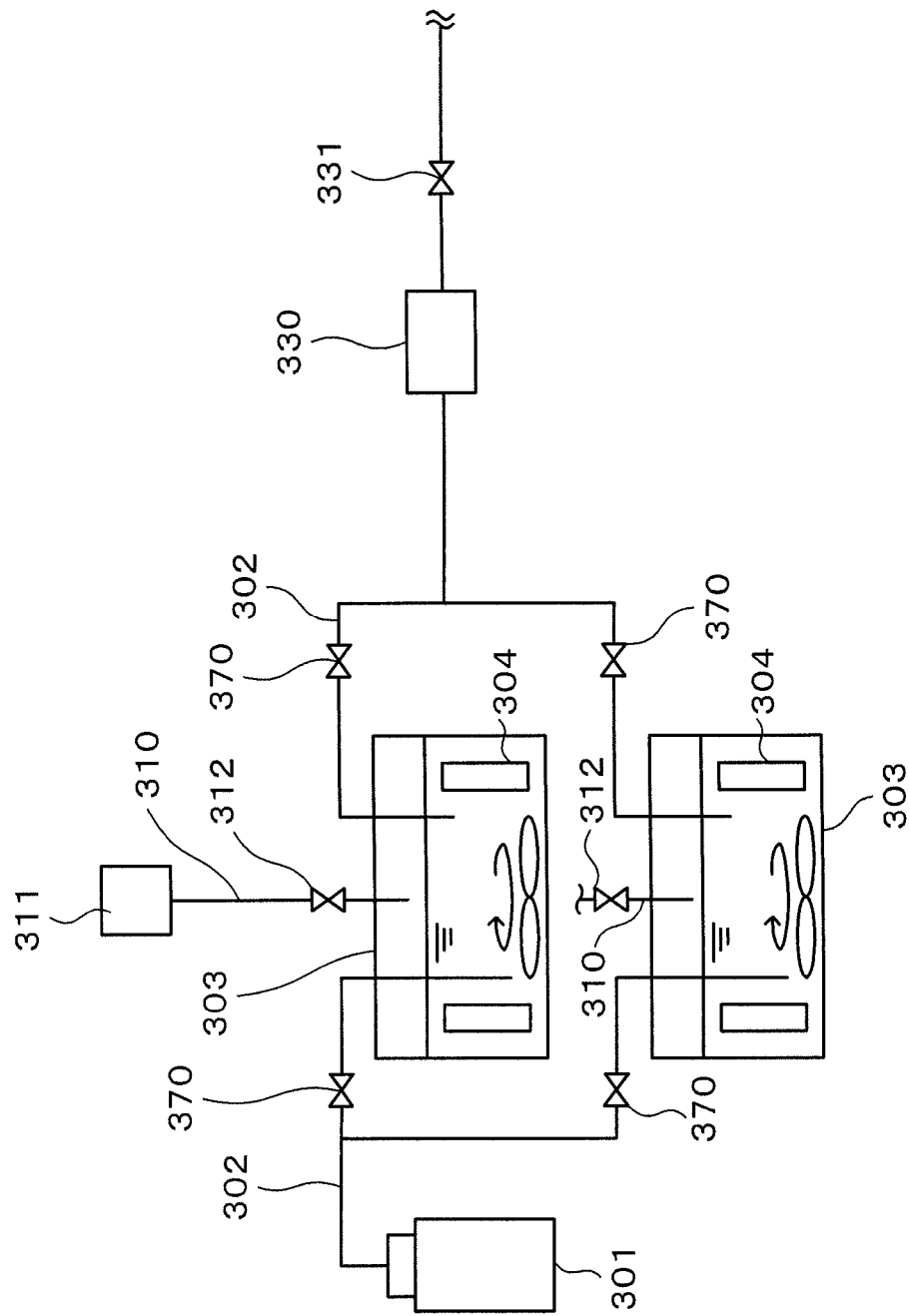
FIG. 23 An explanatory view illustrating the outline of a configuration of a developing solution supply apparatus according to another embodiment.
Figure 24:
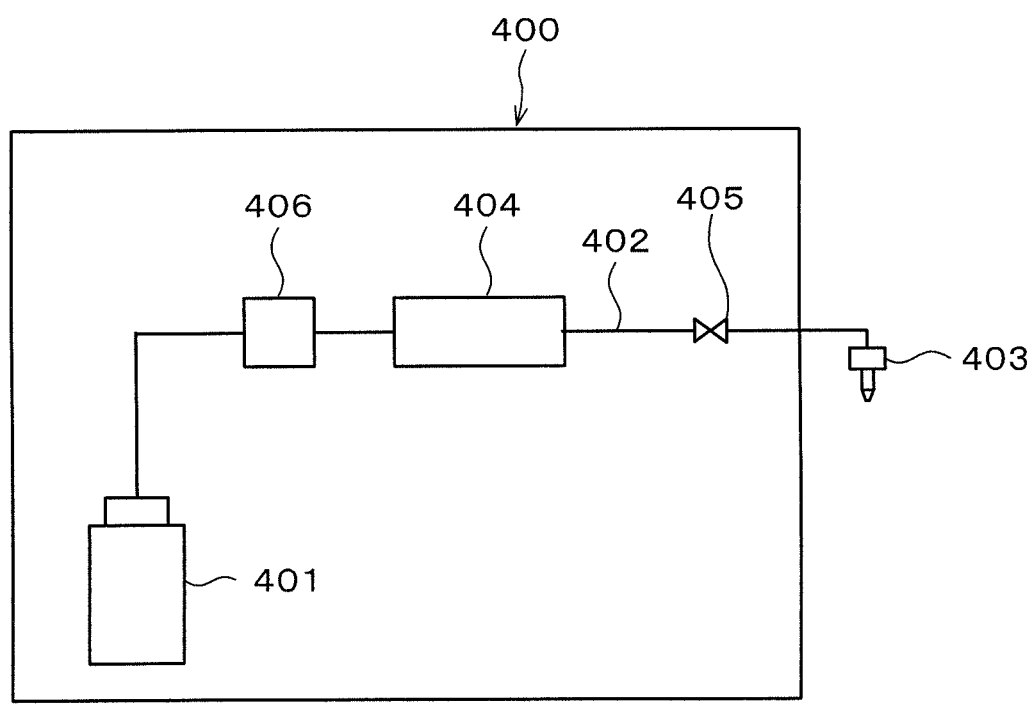
FIG. 24 An explanatory view illustrating the outline of a configuration of a conventional treatment solution supply apparatus.

Note that one intermediate storage tank 303 is provided for one developing solution nozzle 142 in the above embodiment, but a plurality of intermediate storage tanks 303 may be arranged in parallel along the developing solution supply pipe 302, for example, as illustrated in FIG. 23. At the upstream side and the downstream side of each of the intermediate storage tanks 303 arranged in parallel, valves 370 are provided so that from which intermediate storage tank 303 the developing solution is supplied to the developing solution nozzle 142 can be selected by operating the valves 370. In this case, even when one intermediate storage tank 303 and electrodes 304 are cleaned, the developing solution from which the foreign substances have been removed can be supplied to the developing solution nozzle 142 from the other intermediate storage tank 303. Therefore, the supply of the developing solution is never stopped during the cleaning of the intermediate storage tank 303 and the developing solution from which the foreign substances have been removed can be continuously supplied to the developing solution nozzle 142. Note that though two intermediate storage tanks 303 are provided in parallel in FIG. 23, the number of intermediate storage tanks 303 to be installed can be arbitrarily set. Further, when a plurality of developing solution nozzles 142 are provided, the developing solution supply apparatus 190 may be used in common between the plurality of developing solution nozzles 142.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The present invention is not limited to the embodiments but can take various forms, and is also applicable to a case of supplying another treatment solution such as a thinner being a solvent for the resist solution used for the pre-wet before application of the resist solution. The present invention is also applicable to the case where the substrate is a substrate other than the wafer, such as an FPD (Flat Panel Display), a mask reticle for a photomask or the like. Further, the present invention is applicable to a cleaning solution supply apparatus as a treatment solution supply apparatus.

INDUSTRIAL APPLICABILITY

The present invention is useful in supplying a treatment solution, for example, to a substrate such as a semiconductor wafer or the like.

EXPLANATION OF CODES 1 substrate treatment system
2 cassette station
3 treatment station
4 exposure apparatus
5 interface station
6 control unit
10 cassette transfer-in/out section
11 wafer transfer section
12 cassette mounting table
13 mounting plate
20 transfer path
21 wafer transfer apparatus
30 developing treatment unit
31 lower anti-reflection film forming unit
32 resist coating unit
33 upper anti-reflection film forming unit
34 chemical box
40 thermal treatment unit
41 adhesion unit
42 edge exposure unit
70 wafer transfer apparatus
80 shuttle transfer apparatus
90 wafer transfer apparatus
100 wafer transfer apparatus
120 treatment container
130 spin chuck
132 cup
140 rail
141 arm
142 developing solution nozzle
150 another arm
151 pure water nozzle
190 developing solution supply apparatus
200 pure water supply apparatus
201 developing solution storage tank
202 developing solution supply pipe
205 filter
210 pump
211 valve
212 electrode
213 power supply unit
214 valve
215 cleaning solution supply pipe
216 cleaning solution supply source
217 valve
220 waste solution pipe
221 valve
240 electrode
250 electrode
301 developing solution storage tank
302 developing solution supply pipe
303 intermediate storage tank
304 electrode
305 power supply unit
310 cleaning solution supply pipe
311 cleaning solution supply source
312 valve
320 waste solution pipe
321 valve
322 waste solution part
323 stirrer
330 pump
331 valve
340 electrode
341 raising and lowering mechanism
350 rotation shaft
351 electrode
352 rotation mechanism
360 electrode
W wafer
D wafer transfer region
C cassette
P fine particle

What is claimed is:

1. A treatment solution supply apparatus that supplies a treatment solution from a treatment solution supply source via a treatment solution supply pipe to a supply nozzle that supplies the treatment solution to a substrate, the treatment solution supply apparatus comprising:
electrodes having a positive electrode and a negative electrode that are provided at the treatment solution supply pipe and apply a DC voltage to the treatment solution in the treatment solution supply pipe;
a power supply unit that applies the DC voltage at the same time to both the positive electrode and the negative electrode, to apply positive and negative DC voltages at the same time to the treatment solution in the treatment solution supply pipe, while freely reversing a polarity of the DC voltage; and
a cleaning solution supply pipe that is connected to the treatment solution supply pipe and configured to supply a cleaning solution from a cleaning solution supply source to the treatment solution supply pipe,
wherein the positive electrode and the negative electrode of the electrodes are provided to extend along the treatment solution supply pip in a flow direction of the treatment solution in the treatment solution supply pipe and face each other.

2. The treatment solution supply apparatus according to claim 1,
wherein a plurality of the treatment solution supply pipes are provided in parallel to each other, and
wherein positive electrodes and negative electrodes of the electrodes are alternately provided between the plurality of treatment solution supply pipes adjacent to each other in a manner to hold each of the treatment solution supply pipes therebetween.

3. The treatment solution supply apparatus according to claim 1,
wherein the electrodes are provided concentric with a central axis of the treatment solution supply pipe.

4. The treatment solution supply apparatus according to claim 1,
wherein at least one of the positive electrode and the negative electrode of the electrodes is provided inside the treatment solution supply pipe.

5. A treatment solution supply apparatus that supplies a treatment solution from a treatment solution supply source via a treatment solution supply pipe to a supply nozzle that supplies the treatment solution to a substrate, the treatment solution supply apparatus comprising:
electrodes having a positive electrode and a negative electrode that are provided at the treatment solution supply pipe and apply a DC voltage to the treatment solution in the treatment solution supply pipe;
a power supply unit that applies the DC voltage at the same time to both the positive electrode and the negative electrode, to apply positive and negative DC voltages at the same time to the treatment solution in the treatment solution supply pipe, while freely reversing a polarity of the DC voltage;
a cleaning solution supply pipe that is connected to the treatment solution supply pipe and configured to supply a cleaning solution from a cleaning solution supply source to the treatment solution supply pipe; and
a waste solution pipe that drains the cleaning solution passed through a position of the treatment solution supply pipe where the electrodes are provided, from the treatment solution supply pipe.

6. The treatment solution supply apparatus according to claim 5,
wherein the cleaning solution supply pipe is connected to a downstream side of the electrodes along the treatment solution supply pipe, and
wherein the waste solution pipe is connected to an upstream side of the electrodes along the treatment solution supply pipe.

7. A treatment solution supply apparatus that supplies a treatment solution from a treatment solution supply source via a treatment solution supply pipe to a supply nozzle that supplies the treatment solution to a substrate, the treatment solution supply apparatus comprising:
an intermediate storage tank that is provided between the treatment solution supply source and the supply nozzle along the treatment solution supply pipe and temporarily stores the treatment solution supplied from the treatment solution supply source,
wherein the intermediate storage tank comprises:
electrodes having a positive electrode and a negative electrode that apply a DC voltage to the treatment solution stored inside the intermediate storage tank;
a power supply unit that applies the DC voltage at the same time to both the positive electrode and the negative electrode, to apply positive and negative DC voltages at the same time to the treatment solution in the treatment solution supply pipe, while freely reversing a polarity of the DC voltage; and
a cleaning solution supply pipe that supplies a cleaning solution to the intermediate storage tank,
wherein the intermediate storage tank is provided with a stirring mechanism that relatively moves the treatment solution stored in the intermediate storage tank and the electrodes.

8. The treatment solution supply apparatus according to claim 7,
wherein at least one of the positive electrode and the negative electrode of the electrodes is formed in a mesh plate shape parallel to a bottom surface of the intermediate storage tank and provided inside the intermediate storage tank,
wherein another electrode is provided outside the intermediate storage tank, and
wherein the stirring mechanism is a raising and lowering mechanism that raises and lowers in a vertical direction the electrode provided inside the intermediate storage tank.

9. The treatment solution supply apparatus according to claim 7,
wherein at least one of the positive electrode and the negative electrode of the electrodes is formed in a mesh plate shape and provided along a rotation shaft provided extending in a vertical direction inside the intermediate storage tank,
wherein another electrode is provided outside the intermediate storage tank, and
wherein the stirring mechanism is a rotation mechanism that rotates the rotation shaft.

10. The treatment solution supply apparatus according to claim 7,
wherein the electrodes are each formed in a mesh shape.

11. The treatment solution supply apparatus according to claim 7, further comprising:
a waste solution pipe that drains the cleaning solution from the intermediate storage tank.

12. The treatment solution supply apparatus according to claim 7,
wherein a plurality of the intermediate storage tanks are arranged in parallel along the treatment solution supply pipe.

13. A treatment solution supply method of supplying a treatment solution from a treatment solution supply source via a treatment solution supply pipe to a supply nozzle that supplies the treatment solution to a substrate, the treatment solution supply method comprising:
supplying the treatment solution to the substrate while collecting foreign substances in the treatment solution by electrodes having a positive electrode and a negative electrode that are provided at the treatment solution supply pipe by applying a DC voltage at the same time to both the positive electrode and the negative electrode to the treatment solution in the treatment solution supply pipe, wherein the positive electrode and the negative electrode of the electrodes are provided to extend along the treatment solution supply pipe in a flow direction of the treatment solution in the treatment solution supply pipe and face each other.

14. The treatment solution supply method according to claim 13, wherein stopping the supplying the treatment solution after supplying the treatment solution;

then, supplying a cleaning solution to the treatment solution supply pipe with a polarity of the DC voltage applied to the electrodes reversed or the applying the voltage to the electrodes stopped.

15. A treatment solution supply method of supplying a treatment solution from a treatment solution supply source via a treatment solution supply pipe to a supply nozzle that supplies the treatment solution to a substrate, the treatment solution supply method comprising:

temporarily storing the treatment solution supplied from the treatment solution supply source in an intermediate storage tank that is provided between the treatment solution supply source and the supply nozzle along the treatment solution supply pipe;

then, collecting foreign substances in the treatment solution by electrodes having a positive electrode and a negative electrode that are provided at the intermediate storage tank by applying a DC voltage at the same time to both the positive electrode and the negative electrode to the treatment solution in the intermediate storage tank;

then, supplying the treatment solution from which the foreign substances have been removed in the intermediate storage tank, to the supply nozzle;

stopping the supplying the treatment solution to the supply nozzle, and then reversing a polarity of the DC voltage applied to the electrodes or stopping the applying the voltage to the electrodes;

then, supplying a cleaning solution to the intermediate storage tank to clean an inside of the intermediate storage tank, wherein the intermediate storage tank is provided with a stirring mechanism that relatively moves the treatment solution stored in the intermediate storage tank and the electrodes, wherein the treatment solution stored in the intermediate storage tank and the electrodes are relatively moved at least during the applying the DC voltage to the electrodes.

16. A non-transitory computer-readable storage medium storing a program running on a computer of a control unit that controls a treatment solution supply apparatus to cause the treatment solution supply apparatus to execute a treatment solution supply method of supplying a treatment solution from a treatment solution supply source via a treatment solution supply pipe to a supply nozzle that supplies the treatment solution to a substrate, the treatment solution supply method comprising:

supplying the treatment solution to the substrate while collecting foreign substances in the treatment solution by electrodes having a positive electrode and a negative electrode that are provided at the treatment solution supply pipe by applying a DC voltage at the same time to both the positive electrode and the negative electrode to the treatment solution in the treatment solution supply pipe, wherein the positive electrode and the negative electrode of the electrodes are provided to extend along the treatment solution supply pipe in a flow direction of the treatment solution in the treatment solution supply pipe and face each other.

17. A non-transitory computer-readable storage medium storing a program running on a computer of a control unit that controls a treatment solution supply apparatus to cause the treatment solution supply apparatus to execute a treatment solution supply method of supplying a treatment solution from a treatment solution supply source via a treatment solution supply pipe to a supply nozzle that supplies the treatment solution to a substrate, the treatment solution supply method comprising:

temporarily storing the treatment solution supplied from the treatment solution supply source in an intermediate storage tank that is provided between the treatment solution supply source and the supply nozzle along the treatment solution supply pipe;

then, collecting foreign substances in the treatment solution by electrodes having a positive electrode and a negative electrode that are provided at the intermediate storage tank by applying a DC voltage at the same time to both the positive electrode and the negative electrode to the treatment solution in the intermediate storage tank;

then, supplying the treatment solution from which the foreign substances have been removed in the intermediate storage tank, to the supply nozzle;

stopping the supplying the treatment solution to the supply nozzle, and then reversing a polarity of the DC voltage applied to the electrodes or stopping the applying the voltage to the electrodes;

then, supplying a cleaning solution to the intermediate storage tank to clean an inside of the intermediate storage tank, wherein the intermediate storage tank is provided with a stirring mechanism that relatively moves the treatment solution stored in the intermediate storage tank and the electrodes, wherein the treatment solution stored in the intermediate storage tank and the electrodes are relatively moved at least during the applying the DC voltage to the electrodes.

* * * * *